United States Patent
Kubota et al.

[11] Patent Number: 5,808,595
[45] Date of Patent: Sep. 15, 1998

[54] THIN-FILM TRANSISTOR CIRCUIT AND IMAGE DISPLAY

[75] Inventors: Yasushi Kubota, Sakurai; Masahiro Adachi, Nara; Hiromi Sakamoto, Kashiba; Narihiro Morosawa, Tenri, all of Japan

[73] Assignee: Sharp Kabushiki Kaisha, Osaka, Japan

[21] Appl. No.: 674,601

[22] Filed: Jun. 28, 1996

[30] Foreign Application Priority Data

Jun. 29, 1995 [JP] Japan .................................. 7-164148
Mar. 4, 1996 [JP] Japan .................................. 8-046511

[51] Int. Cl.⁶ .................................................. G09G 3/36
[52] U.S. Cl. .......................... 345/92; 345/98; 349/41; 349/42; 349/43; 257/72; 257/291; 257/365
[58] Field of Search .............................. 345/92, 98, 99, 345/100; 349/41–53, 151, 152; 257/72, 257, 258, 291, 365

[56] References Cited

U.S. PATENT DOCUMENTS

| | | | |
|---|---|---|---|
| 5,353,133 | 10/1994 | Bernkopf | 359/41 |
| 5,488,236 | 1/1996 | Baliga et al. | 257/132 |
| 5,574,475 | 11/1996 | Callahan, Jr. et al. | 345/100 |
| 5,648,792 | 7/1997 | Sato et al. | 345/92 |

FOREIGN PATENT DOCUMENTS

| | | |
|---|---|---|
| 60-64379 | 4/1985 | Japan . |
| 64-25132 | 1/1989 | Japan . |
| 1-189632 | 7/1989 | Japan . |

*Primary Examiner*—Steven J. Saras
*Assistant Examiner*—Vincent E. Kovalick

[57] ABSTRACT

A thin-film transistor circuit, which is used as a driving circuit for driving pixels in an image display, is constituted of a plurality of thin-film transistors that are formed on an insulating substrate. In each thin-film transistor, a conductive electrode is placed so as to face a gate electrode with a channel region of a polycrystal silicon thin-film that forms an active layer located in between. Here, a constant voltage is applied to the conductive electrode. When threshold voltage is shifted by applying a voltage to the conductive electrode, it is possible to allow the absolute value of the threshold voltage of n-channel-type transistors and the absolute value of the threshold voltage of p-channel-type transistors to become virtually equal to each other. Moreover, it is possible to properly set the threshold voltage in accordance with factors such as the channel length of the thin-film transistors, the types of circuits that are constituted of the thin-film transistors and voltages to be applied to the thin-film transistors. Thus, it becomes possible to remarkably improve the characteristics of thin-film transistor circuits, such as operation speeds and holding characteristics.

57 Claims, 23 Drawing Sheets

THIN-FILM TRANSISTOR CIRCUIT AND IMAGE DISPLAY

FIELD OF THE INVENTION

The present invention relates to a thin-film transistor circuit used in a driving circuit in an image display such as a liquid crystal display, and also concerns an image display of the active-matrix driving system wherein such a thin-film transistor circuit is used.

BACKGROUND OF THE INVENTION

At present, image displays of the active-matrix driving system are well known as one type of image display widely used. As illustrated in FIG. 19(a), the image display of this type is provided with a pixel array 101, a scanning-signal-line driving circuit 102 and, a data-signal-line driving circuit 103.

The scanning-signal-line driving circuit 102 releases a scanning signal to each of scanning signal lines $GL_j$, $GL_{j+1}$, . . . etc. (these will be described later) in the pixel array 101 by using synchronous signals CKG, GPS and a start pulse SPG. The data-signal-line driving circuit 103, on the other hand, transfers (or transfers after having amplified) an inputted video signal DAT to each of data signal lines $SL_i$, $SL_{i+1}$, . . . etc. (described later), by using a synchronous signal CKS and a start pulse SPS.

In the pixel array 101, there are a number of scanning signal lines $GL_j$, $GL_{j+1}$, . . . etc. and a number of data signal lines $SL_i$, $SL_{i+1}$, . . . etc. that orthogonally intersect one another. In each area enclosed by the adjacent two scanning lines GL and the adjacent two data signal lines SL, a pixel 104 (indicated by PIX in the drawing) is disposed one by one. Thus, the pixels 104 are disposed in a matrix shape within the pixel array 101, and one data signal line SL is connected to each row and one scanning signal line GL is connected to each line.

As illustrated in FIG. 19(b), in the case of a liquid crystal display, each pixel 104 is constituted of a transistor T that functions as a switching element and a pixel capacity $C_P$ having a liquid crystal capacity $C_L$. In general, the pixel capacity $C_P$, in an liquid crystal display of the active-matrix system has a storage capacity $C_S$ that is added to the liquid crystal capacity $C_L$ in parallel therewith. The storage capacity $C_S$, is required for reducing to a minimum influences such as those of leakage currents of the liquid crystal capacity $C_L$ and the transistor T, fluctuations of pixel voltages due to parasitic capacities such as a capacity between the gate and source of the transistor T and a capacity between a pixel electrode and a signal line, and dependence of the liquid crystal capacity $C_L$ on display data.

The gate of the transistor T is connected to the scanning signal line $GL_j$. Further, one of the electrodes of the liquid crystal capacity $C_L$ and one of the electrodes of the storage capacity $C_S$, are connected to the data signal line $SL_i$ through the drain and source of the transistor T. The other electrode of the liquid crystal capacity $C_L$ is connected to an opposing electrode with a liquid crystal sandwiched in between, and the other electrode of the storage capacity $C_S$, is connected to a common electrode line, not shown, that is commonly used by all the pixels (in the case of Cs on Common Construction), or to an adjacent scanning signal line GL (in the case of Cs on Gate Construction).

A number of scanning signal lines $GL_j$, $GL_{j+1}$, . . . etc. are connected to the scanning-signal-line driving circuit 102 and a number of data signal lines $SL_i$, $SL_{i+1}$, . . . etc. are connected to the data-signal-line driving circuit 103. Here, the scanning-signal-line driving circuit 102 and the data-signal-line driving circuit 103 are respectively driven by source voltages $V_{GH}$, $V_{GL}$ and source voltages $V_{SH}$, $V_{SL}$ that are different from one another.

In the above-mentioned image display, the data-signal-line driving circuit 103 releases a display-use data signal to the data signal lines $SL_i$, $SL_{i+1}$, . . . etc., for each pixel, or for each horizontal scanning period (1H line). Further, when the scanning signal lines $GL_j$, $GL_{j+1}$, . . . etc. are activated, the transistor T conducts. Thus, the display-use data signal, which has been sent to the data signal lines $SL_i$, $SL_{i+1}$, . . . etc., is written to the pixel capacity $C_P$, as a charge. Then, the charge thus written to the pixel capacity $C_P$ maintains a display.

The data-signal-line driving circuit 103 is classified into two systems, the point-sequential driving system and the line-sequential driving system.

As illustrated in FIG. 20, in the data-signal-line driving circuit 103 of the point-sequential driving system, an inputted start pulse SPS is sequentially shifted by a shift register 111 (indicated by SR in the drawing) in synchronism with the synchronous signal CKS. The resulting outputted pulse is fed to a sampling switch 113 (indicated by SWT in the drawing) through buffer circuits 112 (indicated by BUF in the drawing). When the sampling switch 113 conducts in response to the pulse, the video signal DAT is fed to the data signal lines $SL_i$, $SL_{i+1}$, . . . etc. through the sampling switch 113.

The data-signal-line driving circuit 103 of the point-sequential driving system is designed to transfer the video signal DAT to the data signal lines $SL_i$, $SL_{i+1}$, . . . etc. through the sampling switch 113; therefore, this construction makes the driving circuit compacter. In contrast, since the data-signal-line driving circuit 103 has only a short writing period, it has some limitations in meeting the demands for large screens.

As illustrated in FIG. 21, in the data-signal-line driving circuit 103 of the line-sequential driving system, a video signal DAT that has been inputted during a certain horizontal scanning period is sampled by the sampling switches 113, and then temporarily stored in sampling capacities $C_{smp}$. At the beginning of the next horizontal scanning period, the sampling data thus stored (charge) is transferred to holding capacities $C_h$ through sampling switches 114 that conduct in synchronism with a data transfer signal TRF, and held therein. Further, during this horizontal scanning period, a signal having the same level as voltages held in the holding capacities $C_h$ is written to the data signal lines $SL_i$, $SL_{i+1}$, . . . etc. through buffer amplifiers 115 (indicated by AMPs in the drawing).

The data-signal-line driving circuit 103 of the line-sequential driving system is designed to transfer the video signal that has been temporarily sampled and that corresponds to one line as a batch to the data signal lines SL, resulting in a construction that makes the driving circuit larger. In contrast, since the data-signal-line driving circuit 103 provides a sufficient writing period, it is possible to meet the demands for large screens.

As illustrated in FIG. 22, in the scanning-signal-line driving circuit 102, the inputted start pulse SPG is sequentially shifted by the shift registers 111 in synchronism with a synchronous signal CKG. The resulting pulses, outputted from the adjacent two shift registers 111, pass through the buffer circuits 112, and are subjected to the logical AND in an AND circuit 116 (indicated by AND in the drawing).

Further, a scanning signal is generated by an AND circuit 117 (indicated by AND in the drawing) through the logical AND of the output of the AND circuit 116 and a synchronous signal GPS for determining its signal width. This scanning signal is fed to the scanning signal lines $GL_j$, $GL_{j+1}$, . . . etc. through a buffer 118 (indicated by BUF in the drawing).

Additionally, in the above-mentioned scanning-signal-line driving circuit 102, a buffer 118 having a level shifter installed therein may be adopted to increase the output amplitude of the scanning signal.

Conventionally, in most of the liquid crystal displays of the active-matrix type, the aforementioned pixels 104 have been constituted of amorphous silicon thin-film transistors that are formed on a glass substrate. Further, the scanning-signal-line driving circuit 102 and the data-signal-line driving circuit 103 are constituted of a plurality of driver ICs that have been externally attached to the glass substrate.

In recent years, however, in order to achieve compactness, high reliability, low costs and other features of image displays, a technological method has been developed wherein the scanning-signal-line driving circuit 102 and the data-signal-line driving circuit 103 are monolithically formed on the same substrate together with the pixel array 101.

In this case, field effect transistors, which are constituted of either mono-crystal, polycrystal, or amorphous silicon thin-films, are used as active elements. Actually, polycrystal silicon thin-film transistors are most commonly used, because they can be formed on a transparent glass substrate with a large area and because they provide a high driving power that is required by the scanning-signal-line driving circuit 102 and the data-signal-line driving circuit 103.

Conventional polycrystal silicon thin-film transistors have a construction that is, for example, shown in FIG. 23. In this construction, an anti-contamination silicon oxide film 122 is deposited on an insulating substrate 121, and the field effect transistors are formed thereon. The insulating substrate 121 is often made of a substrate such as a sapphire substrate, a quartz substrate and a nonalkali glass.

The field effect transistor is constituted of a polycrystal silicon thin-film 123 consisting of a channel region 123a, a source region 123b and a drain region 123c that are formed on the silicon oxide film 122, and a gate insulating film 124, a gate electrode 125, a silicon oxide film 126 and metal wiring 127 that are further formed thereon.

At present, however, in the polycrystal silicon thin-film transistors, it is difficult to fully control their threshold voltage, and in some cases they fail to provide sufficient characteristics that are required for driving circuits for use in image displays.

In general, the polycrystal silicon thin-film 123 that forms an active layer tends to exhibit n-type properties; therefore, the threshold voltage of an n-channel-type transistor (hereinafter, referred to as an nch-transistor) and the threshold voltage of a p-channel-type transistor (hereinafter, referred to as a pch-transistor) are both shifted in the negative direction. In other words, the nch-transistor tends to have more factors of depletion, and also tends to relatively have an increased driving power with an increased OFF-state current under a constant source voltage. In contrast, the pch-transistor tends to have a high threshold voltage value and its driving power tends to drop to a great degree.

For this reason, the balance between the driving power of the nch-transistor and that of the pch-transistor tends to be upset, resulting in an increase in the leakage current of the nch-transistor.

When there is a great unbalance between the driving powers of these transistors as described above, the characteristics of the driving circuits might be deteriorated to a great degree. For example, shift registers, which are often installed commonly within the scanning-signal-line driving circuit 102 and the data-signal-line driving circuit 103, have their operation speeds determined by the characteristics of transistors that are inferior in their characteristics (that has a smaller driving force) when they are constituted of CMOS circuits. Therefore, when the pch-transistor has a high threshold voltage, the good characteristics of the nch-transistor cannot be sufficiently demonstrated. Moreover, in sampling circuits (sampling switches 113 and 114) or other circuits that require high holding characteristics, the use of nch-transistors having a low threshold voltage and a great off current tends to deteriorate their normal operation.

Furthermore, in addition to an unbalance between the threshold voltage of the nch-transistor and that of the pch-transistor, it is not preferable to have great absolute values of the respective threshold voltages. For example, their threshold voltages are sometimes as high as not less than 30% of the source voltage. Such a phenomenon causes a reduction in the driving power of transistors, resulting in low performances of the driving circuits.

In order to prevent dispersions in the characteristics (threshold voltages) of thin-film transistors that constitute an image display, for example, Japanese Laid-Open Patent Publication No. 189632/1989 (Tokukaihei 1-189632) has disclosed a technique. In this technique, an electrode is installed so as to face a gate electrode in a thin-film transistor, and the threshold value of the thin-film transistor is changed by changing the voltage to be applied to this electrode.

However, the above-mentioned technique replaces the adjustment between the voltage level of a scanning signal and the voltage level of a video signal that is determined by the threshold value of a thin-film transistor that functions as a pixel switch with the adjustment of the voltage level of the above-mentioned electrode; therefore, this arrangement fails to improve the characteristics of a driving circuit itself. Thus, the above-mentioned technique cannot possibly solve the aforementioned problems fundamentally.

SUMMARY OF THE INVENTION

It is an objective of the present invention to provide a thin-film transistor circuit having an improved operation speed, holding characteristics and other characteristics, and an image display wherein such a thin-film transistor circuit is used as its driving circuit.

In order to achieve the above-mentioned objective, the first thin-film transistor circuit of the present invention, which is used as a driving circuit for driving pixels in an image display, is provided with:

a plurality of thin-film transistors that are formed on an insulating substrate;

a gate electrode and an active layer that are installed in each of the thin-film transistors; and a conductive electrode that is commonly installed in each of the thin-film transistors in such a manner as to face the gate electrode with a channel region that is formed inside the active layer located in between. Here, a constant voltage is applied to the conductive electrode.

In the first thin-film transistor circuit, the conductive electrode is placed so as to face the corresponding gate electrode with the channel region of the active layer located in between, and a constant voltage is applied to the conductive electrode. At this time, since the potential of the active layer is changed, an excess voltage with the reversed polarity is applied to the gate electrode to the extent that it cancels the change. As a result, it is possible to shift the threshold voltage of the thin-film transistor in accordance with the applied voltage.

With this arrangement, even if the threshold voltage of the thin-film transistor is offset in the negative direction or the positive direction from a desired value for a certain reason, it is possible to make virtually equal to each other the absolute value of the threshold voltage of the n-channel-type transistor and the absolute value of the threshold voltage of the p-channel-type transistor by shifting the threshold voltage by applying a voltage to the conductive electrode.

As described above, the first thin-film transistor circuit makes it possible to improve characteristics, such as the operation speed and holding characteristic, to a great degree.

The above-mentioned conductive electrodes in the first thin-film transistor are preferably arranged as described below:

(1) The conductive electrodes are placed only either on the n-channel-type thin-film transistors or on the p-channel-type thin-film transistors.

(2) They are placed on thin-film transistors whose channel length is located within a predetermined range.

(3) They are placed only either on thin-film transistors constituting a static circuit or thin-film transistors constituting a dynamic circuit.

(4) They are placed only on thin-film transistors that constitute a circuit that is driven by the same driving voltage.

(5) They are placed only either on thin-film transistors that constitute an analog circuit or on thin-film transistors that constitute a digital circuit.

In the above-mentioned first thin-film transistor circuit, the threshold voltage can be set as follows in accordance with the above-mentioned arrangements (1) through (5).

In the case when transistors of one channel-type among thin-film transistors have an extremely high or low threshold voltage, the conductive electrodes are placed only on those thin-film transistors; thus, it is possible to shift the threshold voltage of only those thin-film transistors. With this arrangement, for example, in the case when the threshold voltage of p-channel transistors is high, and needs to be shifted in the positive direction, the threshold voltage of n-channel transistors is not increased. Therefore, since the threshold voltage of only a desired channel-type of thin-film transistors can be properly adjusted, it is possible to provide a thin-film transistor circuit with superior operation performances.

In the case when the threshold voltage of thin-film transistors varies depending on their channel length, by installing conductive electrodes only in thin-film transistors whose channel lengths are located within a predetermined range, it is possible to shift the threshold voltage of only the corresponding thin-film transistors. With this arrangement, even in a thin-film transistor circuit having a plurality of thin-film transistors with different channel lengths in a mixed manner, it is possible to adjust the characteristics of only the thin-film transistors having specific channel lengths. Therefore, this arrangement makes it possible to improve the operation characteristics of a thin-film transistor having thin-film transistors with different channel lengths in a mixed manner.

In the case when a thin-film transistor circuit is constituted of a static circuit and a dynamic circuit, by installing conductive electrodes only in the thin-film transistors that constitute either of the circuits, it is possible to shift the threshold voltage of only the corresponding thin-film transistors. With this arrangement, for the static circuit which requires a high-speed operation, the threshold voltage of the thin-film transistors is set to a relatively low value. For the dynamic circuit which requires a high holding characteristic (wherein small leakage current is required), on the other hand, the threshold voltage of the thin-film transistors is set to a relatively high value. Thus, it is possible to meet the requirement for either of the circuits. Consequently, it becomes possible to improve the operation characteristics of either the static circuit or the dynamic circuit in the thin-film transistor circuit.

In the case when a thin-film transistor circuit is classified into groups which are driven by different driving voltages, by installing conductive electrodes only in the thin-film transistors constituting one group of the circuits that are driven by the same driving voltage, it is possible to shift the threshold voltage of only the corresponding thin-film transistors. With this arrangement, it is possible to set a threshold voltage that is suitable for, for example, either a group of circuits that are driven by a low voltage or a group of circuits that are driven by a high voltage. Consequently, it becomes possible to improve operation characteristics of a circuit that is driven by a specific voltage.

In the case when a thin-film transistor circuit is constituted of an analog circuit and a digital circuit, by installing conductive electrodes only in the thin-film transistors that constitute either of the circuits, it is possible to shift the threshold voltage of only the corresponding thin-film transistors. With this arrangement, for the analog circuit which requires an analog signal level with high precision, the threshold voltage of the thin-film transistors is set to a relatively high value in order to suppress leakage currents. For the digital circuit which requires a high-speed operation, on the other hand, the threshold voltage of the thin-film transistors is set to a relatively low value. Thus, it is possible to meet the requirement for either of the circuits. Consequently, it becomes possible to improve the operation characteristics of either the analog circuit or the digital circuit in the thin-film transistor circuit.

In order to achieve the above-mentioned objective, the second thin-film transistor circuit of the present invention, which is used as a driving circuit for driving pixels in an image display, is provided with:

a plurality of thin-film transistors that are formed on an insulating substrate and that are classified into groups based upon predetermined attributes, each thin-film transistor being provided with a gate electrode and an active layer; and a plurality of conductive electrodes that are commonly installed in each group of the thin-film transistors in such a manner that each faces the gate electrode with a channel region that is formed inside the active layer located in between. Here, constant voltages, each of which is different from the others, are applied to the conductive electrodes.

In the second thin-film transistor circuit, the conductive electrodes are placed so that each faces the corresponding gate electrode with the channel region of the active layer located in between, and the constant voltages, each of which is different from the others, are applied to the conductive electrodes. Thus, in the same manner as the first thin-film transistor circuit, it is possible to shift the threshold voltage of the corresponding thin-film transistors. Here, a plurality of conductive electrodes are installed in each group, and voltages, each of which is different from the others, are applied to the respective groups; therefore, in a circuit having thin-film transistors in a mixed manner that are classified into groups based upon their attributes such as channel types and channel lengths, it is possible to shift a desired number of the threshold voltages in accordance with the respective types of the thin-film transistors.

Therefore, with respect to operation speeds, holding characteristics and other aspects, it is possible to provide a thin-film transistor circuit that has better characteristics than the aforementioned first thin-film transistor circuit.

The above-mentioned conductive electrodes in the second thin-film transistor are preferably arranged as described below:

(6) The conductive electrodes are placed on the n-channel-type thin-film transistors and on the p-channel-type thin-film transistors in a separate manner.

(7) With respect to thin-film transistors that are classified into groups depending on their channel lengths, they are placed on thin-film transistors in a separate manner based on the respective groups.

(8) With respect to thin-film transistors constituting a static circuit and those constituting a dynamic circuit, they are placed in a separate manner based on the two types of circuits.

(9) With respect to thin-film transistors that are classified into groups depending on their driving voltages, they are placed on thin-film transistors in a separate manner based on the respective groups.

(10) With respect to thin-film transistors constituting an analog circuit and those constituting a digital circuit, they are placed in a separate manner based on the two types of circuits.

(11) With respect to thin-film transistors that are classified into groups depending on their channel lengths, they are placed on the thin-film transistors of only any of the groups.

(12) With respect to thin-film transistors that are classified into groups depending on their driving voltages, they are placed on the thin-film transistors of only any of the groups.

In the above-mentioned second thin-film transistor circuit, the arrangements described in (6) through (12) allow the threshold voltage to be set as follows:

In the thin-film transistor circuit, since the discrete conductive electrodes are placed in the n-channel-type transistors and in the p-channel-type transistors of the thin-film transistors in a separate manner, it is possible to desirably set the threshold voltages of the respective types of thin-film transistors in a separate manner. Therefore, the degree of freedom in setting the threshold voltage can be improved, and the characteristics of the circuit can be appropriately adjusted.

In the case when thin-film transistors are classified into groups depending on their channel lengths in a thin-film transistor circuit, by installing discrete conductive electrodes in the thin-film transistors for the respective groups, it is possible to set appropriate threshold voltages in accordance with their respective channel lengths. Thus, even in the case when the threshold voltages change depending on the channel lengths with the help of the short channel effect and other effects, it is possible to set the threshold voltages appropriately. Therefore, it becomes possible to appropriately adjust the characteristics of a thin-film transistor circuit wherein thin-film transistors having different channel lengths exist in a mixed manner.

In the case when thin-film transistors are classified into a group constituting a static circuit and a group constituting a dynamic circuit in a thin-film transistor circuit, by installing discrete conductive electrodes in the thin-film transistors for the respective groups, it is possible to set appropriate threshold voltages for the respective circuits. In other words, for the static circuit which requires a high-speed operation, the threshold voltage of the thin-film transistors is set to a relatively low value. For the dynamic circuit which requires a high holding characteristic (wherein small leakage current is required), on the other hand, the threshold voltage of the thin-film transistors is set to a relatively high value. Thus, it is possible to meet the requirements for the respective circuits. Consequently, it becomes possible to improve the operation characteristics of both the static circuit and the dynamic circuit in the thin-film transistor circuit.

In the case when thin-film transistors are classified into groups each of which has a different driving voltage for driving the respective thin-film transistors in a thin-film transistor circuit, by installing discrete conductive electrodes in the thin-film transistors for the respective groups each of which is driven by the same driving voltage, it is possible to shift the threshold voltage of only the corresponding thin-film transistors. With this arrangement, it is possible to set threshold voltages that are suitable for the respective circuit groups. For example, it is possible to desirably set the threshold voltage of one circuit group that is driven by a low voltage as well as the threshold voltage of the other circuit group that is driven by a high voltage in a separate manner. Therefore, it becomes possible to appropriately adjust the characteristics of a thin-film transistor circuit wherein thin-film transistors that are driven by different voltages exist in a mixed manner.

In the case when thin-film transistors are classified into a group constituting an analog circuit and a group constituting a digital circuit in a thin-film transistor circuit, by installing discrete conductive electrodes in the thin-film transistors for the respective groups, it is possible to set appropriate threshold voltages for the respective circuits. In other words, for the analog circuit which requires an analog signal level with high precision, the threshold voltage of the thin-film transistors is set to a relatively high value in order to suppress leakage currents. For the digital circuit which requires a high-speed operation, on the other hand, the threshold voltage of the thin-film transistors is set to a relatively low value. Therefore, it is possible to meet the requirement for either of the circuits. Consequently, it becomes possible to improve the operation characteristics of either the analog circuit or the digital circuit in the thin-film transistor circuit.

In the case when thin-film transistors are classified into groups depending on their channel lengths in a thin-film transistor circuit, by installing conductive electrodes only in the thin-film transistors of any of the respective groups, it is possible to desirably shift a plurality of threshold voltages in a separate manner for only the specific groups of the thin-film transistor circuit that is constituted of the groups having a plurality of channel lengths. Thus, even in the case when the threshold voltages change depending on the channel lengths with the help of the short channel effect and other effects, it is possible to set the threshold voltages appropriately. Therefore, it becomes possible to appropriately adjust the characteristics of a thin-film transistor circuit wherein thin-film transistors having different channel lengths exist in a mixed manner.

In the case when thin-film transistors are classified into groups depending on their driving voltages, by installing conductive electrodes only in the thin-film transistors of any of the respective groups, it is possible to desirably set a plurality of threshold voltages independently for only the specific groups of the thin-film transistor circuit that is constituted of the groups having a plurality of driving voltages. Therefore, it becomes possible to appropriately adjust the characteristics of a thin-film transistor circuit wherein thin-film transistors that are driven by different driving voltages exist in a mixed manner.

In the above-mentioned first and second thin-film transistor circuits, it is preferable to determine the area and position of each conductive electrode so that the conductive electrode faces one portion of the active layer, that is, a channel region and the peripheral area thereof. This arrangement reduces the area at which the conductive electrode faces the source region and drain region that exist on both sides of the channel region in the active layer. Thus, for both of the stagger structure and the reversed stagger structure in the structures of thin-film transistors, it becomes possible to reduce a parasitic capacity that is generated between the conductive electrode and the source and drain regions. Therefore, it is possible to easily provide high speeds in the circuit operation.

Alternatively, in the above-mentioned first and second thin-film transistor circuits, it is preferable to determine the area and position of each conductive electrode so that the conductive electrode faces the active layer in all the area thereof including the channel region thereof. With this arrangement, for thin-film transistors of the stagger structure, no step difference is caused in the source region and drain region that are installed above the conductive electrode due to the peripheral portion of the conductive electrode. Therefore, it is possible to prevent reduction in characteristics due to degradation in crystallization and a film-thickness loss at the step difference, and consequently to provide a thin-film transistor circuit with high quality.

Moreover, in the above-mentioned first and second thin-film transistors, the conductive electrode is preferably made of a light-shielding material. This arrangement makes it possible to shield light that is allowed to be incident on the thin-film transistor, thereby preventing adverse effects such as an increase in leakage current due to the light. Thus, it becomes possible to further improve the quality of the thin-film transistor circuit.

Furthermore, in the above-mentioned first and second thin-film transistors, the active layer is preferably made of a semiconductor thin-film that is formed to have a film thickness of not more than two times the greatest width of a depletion layer. With this arrangement, the semiconductor thin-film is completely subjected to depletion by a voltage that is applied to the gate electrode and the conductive electrode. This makes it possible to shift the threshold voltage more effectively. Therefore, it becomes possible to further improve the characteristics of the first and second thin-film transistor circuits.

Here, in order to achieve the aforementioned objective, the image display of the present invention is provided with:

a plurality of display-use pixels that are formed in a matrix shape;

video-signal applying means (data-signal-line driving circuit) for applying a video signal to these pixels for each line; and writing-control means (scanning-signal-line driving circuit) for controlling a writing process of the video signal to the pixels for each row. Here, at least either the video-signal applying means or the writing-control means is provided with any of the aforementioned thin-film transistor circuits.

With this arrangement, it is possible to improve the operation characteristics of the video-signal applying means and the writing-control means with the help of the characteristics of the respective thin-film transistor circuits.

For a fuller understanding of the nature and advantages of the invention, reference should be made to the ensuing detailed description taken in conjunction with the accompanying drawings.

BRIEF DESCRIPTION OF THE DRAWING

FIG. 1(*b*) is a cross-sectional view showing another structure that is commonly used in thin-film transistors constituting thin-film transistor circuits of the first through sixth embodiments of the present invention.

FIG. 2(*b*) is a plan view showing the layout of a conductive electrode, a polycrystal silicon thin-film and a gate electrode in the thin-film transistor of FIG. 1(*b*).

DESCRIPTION OF THE EMBODIMENT

[Embodiment 1]

Referring to FIGS. 1 through 4, the following description will discuss the first embodiment of the present invention.

Figure 3:
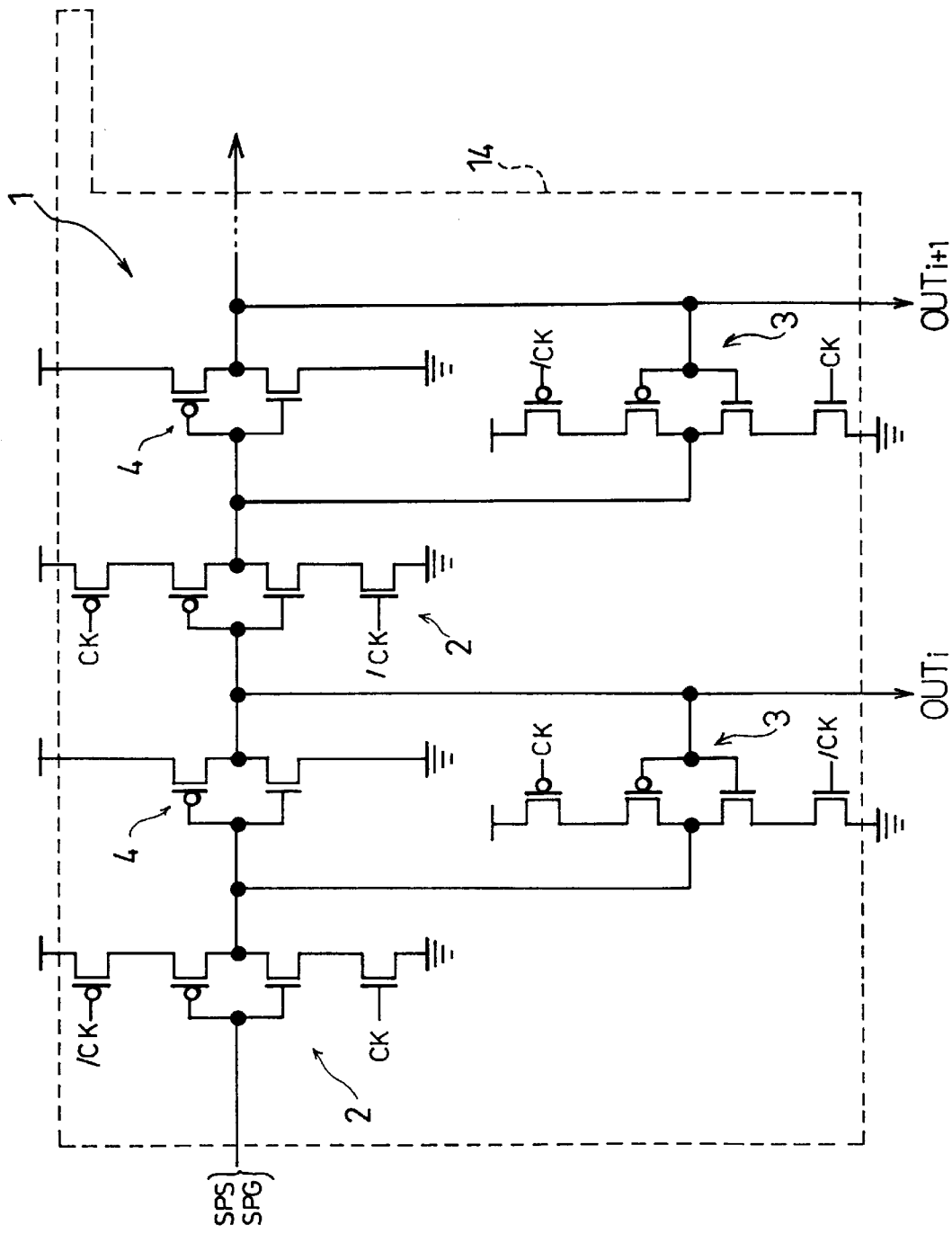
FIG. 3 is a circuit diagram showing a construction of a static-type shift register that is formed by the thin-film transistor circuits of the first embodiment of the present invention, and that is provided with the conductive electrodes on its entire portion.

As shown in FIG. 3, a thin-film transistor circuit of the present embodiment, which serves as a scanning-signal-line driving circuit or a data-signal-line driving circuit used in an image display of the active-matrix driving system, is provided with a shift register 1 of the CMOS construction that shifts a start pulse SPS or SPG.

The shift register 1, which is a static-type shift register, is constituted of a plurality of units, and FIG. 3 shows a construction corresponding to two of the units. The shift register 1 is provided with two clocked inverters 2 and 3 and one inverter 4 per one unit.

The clocked inverter 2 and the inverter 4 are arranged in series with each other on a transferring line of the start pulse SPG or SPS. The clocked inverter 3 is connected in parallel with the inverter 4 so as to have its input and output reversed thereto. Here, the output of the inverter 4 forms outputs $OUT_i$ and $OUT_{i+1}$ of the respective units in the shift register 1, and pulses that have been shifted by the respective units are thus obtained.

Figure 1A:
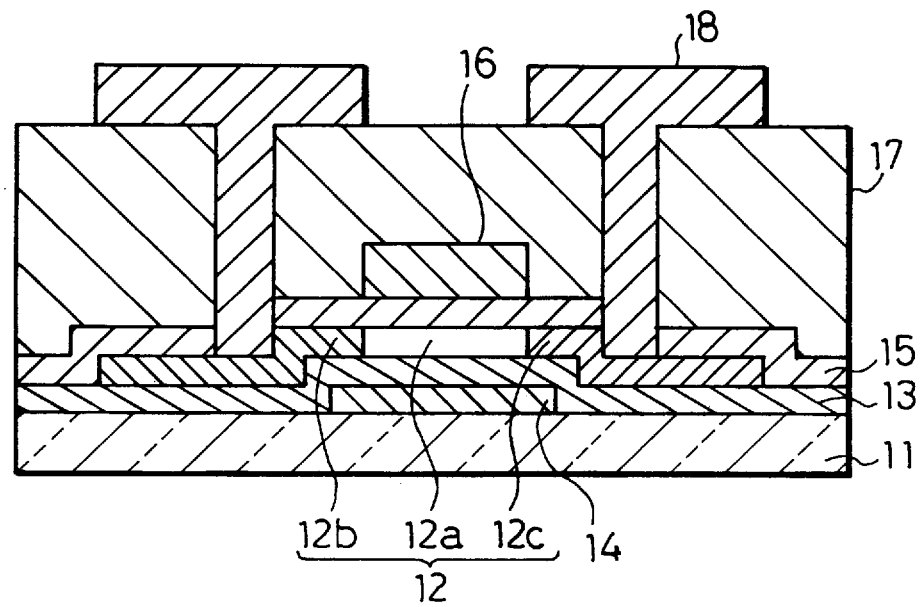
FIG. 1(*a*) is a cross-sectional view showing a structure that is commonly used in thin-film transistors constituting thin-film transistor circuits of the first through sixth embodiments of the present invention.
Figure 1B:
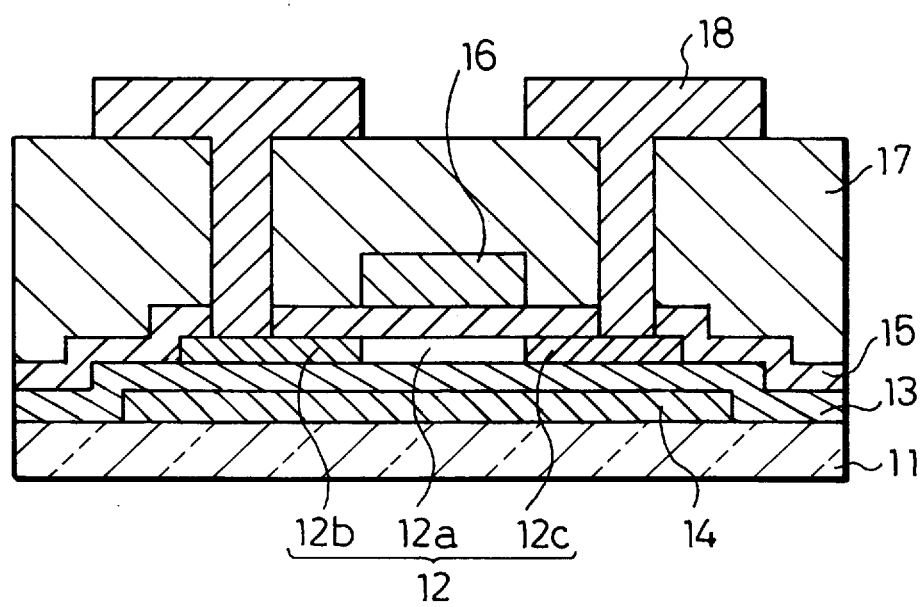

In the above-mentioned shift register 1, all the field-effect transistors (hereinafter referred to simply as transistors) that constitute the clocked inverters 2 and 3 and the inverter 4 are polycrystal silicon thin-film transistors that are formed on an insulating substrate 11, as shown in FIG. 1(a) or FIG. 1(b). The insulating substrate 11 is preferably made of a substrate such as a sapphire substrate, a quartz substrate and a nonalkali-glass substrate.

Further, in all the transistors constituting the shift register 1, a conductive electrode 14 is placed beneath a polycrystal silicon thin-film 12 (hereinafter referred to as a p-Si thin-film) that serves as an active layer, through an insulating film 13 made of a silicon oxide film. A constant voltage is applied to the conductive electrode 14.

The p-Si thin-film 12 is constituted of a channel region 12a, and a source region 12b and a drain region 12c that are placed on both sides of the channel region 12a. On this are further stacked a gate electrode 16 with a gate insulating film 15 located in between, an inter-layer insulating film 17 made of a silicon oxide film, and a metal wiring 18 that forms a source electrode and a drain electrode.

The conductive electrode 14 may be made of a transparent material such as ITO (indium-tin oxide) or may be made of a light-shielding material, such as Ti, Ta, Mo or Cr. When the light-shielding material is used, it becomes possible to suppress an increase in leakage current of the transistors and deterioration in the circuit characteristics caused by external light; therefore, the resulting advantage is that the adverse effects of light can be prevented.

By arranging the conductive electrode 14 as described above and applying a voltage to the conductive electrode 14, it becomes possible to shift the threshold voltage of the transistors. For example, in the case when the nch-transistors turn into those of the depletion type and the absolute value of the threshold voltage of the pch-transistors becomes greater since both the threshold voltage of the nch-transistors and the threshold voltage of the pch-transistors are biased toward the negative side, it is possible to shift the threshold voltages in the positive direction. This is explained as follows: since the potential of the p-Si thin-film 12 serving as an active layer is varied in the negative direction by the voltage applied to the conductive electrode 14, an excess positive voltage has to be applied to the gate electrode 16 to the extent that it cancels the variation of the potential. This change in potential of the p-Si thin-film 12 due to the conductive electrode 14 is generated when charges exist in the entire portion of the p-Si thin-film 12, as can be anticipated by Gauss' law.

In such a state, it is preferable that a depletion layer (an area wherein the gross quantity of charge is not zero) from the surface side (the gate electrode 16 side) of the p-Si thin-film 12 is connected to a depletion layer from the rear surface side (the conductive electrode 14 side) when the transistor conducts. This is based upon the following reasons:

Through the connection between the depletion layer from the surface side and the depletion layer from the rear surface side of the p-Si thin-film 12, the minimum value (or the maximum value) of the potential inside the p-Si thin-film 12 is varied; therefore, the quantity of change in potential that is required to make conduct the thin-film transistor also varies. As a result, it becomes possible to shift the threshold voltage of the thin-film transistor effectively.

Here, in order to allow the depletion layers to connect to each other, the film thickness of the p-Si thin-film 12 is set to not more than two times the maximum width of the depletion layer. Additionally, this condition is also applied to transistors in other embodiments, which will be described later.

In a transistor wherein a p-Si thin-film 12 with a film thickness of 100 nm is used as an active layer, the thickness of the gate insulating film 15 is 150 nm, and the thickness of the insulating film 13 is 300 nm, a voltage of −20 V was actually applied to the conductive electrode 14. As a result, it was observed that the threshold voltage had a shift of 2 to 3 V.

Figure 4:
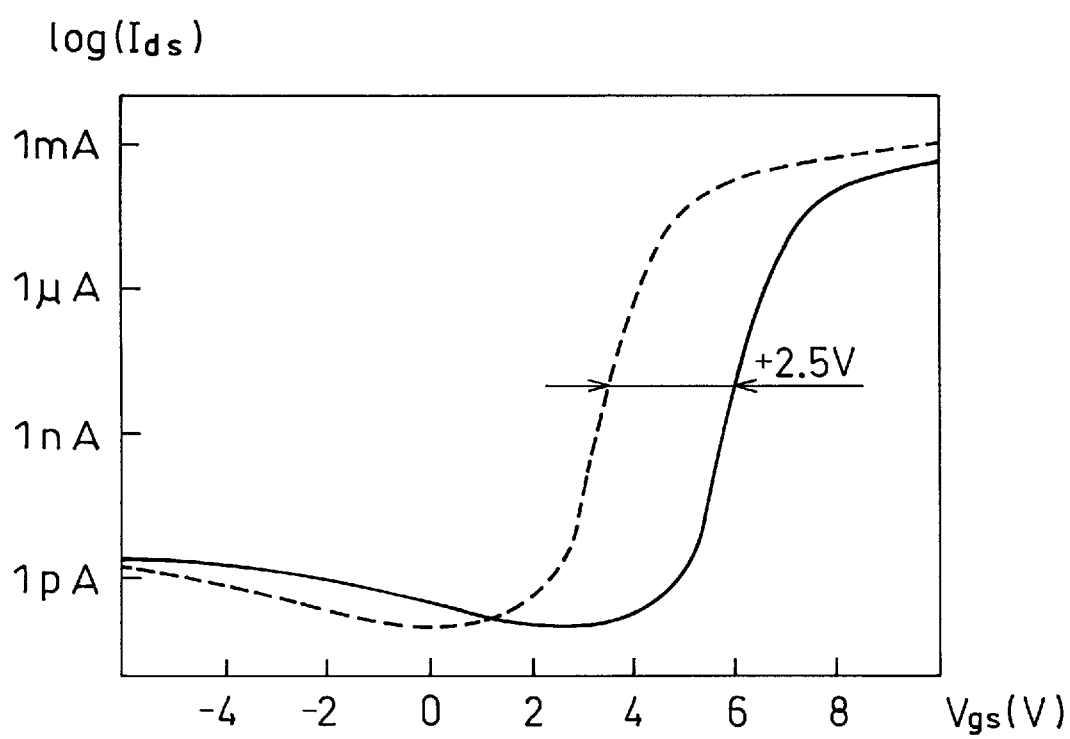
FIG. 4 is a graph showing one example of gate-source voltage vs. drain-source current characteristics of an n-channel-type p-Si thin-film transistor.

FIG. 4 is a graph showing one example of gate-source voltage vs. drain-source current characteristics of an n-channel-type p-Si thin-film transistor. In this graph, the characteristic that is obtained when no bias voltage is applied to the conductive electrode (which has the same electric potential as the source electrode) is indicated by a broken line, and the characteristic that is obtained when a bias voltage of −20 V is applied to the conductive electrode is indicated by a solid line. These characteristics show that the threshold voltage is shifted by 2.5 V by the application of the bias voltage to the conductive electrode.

Figure 2A:
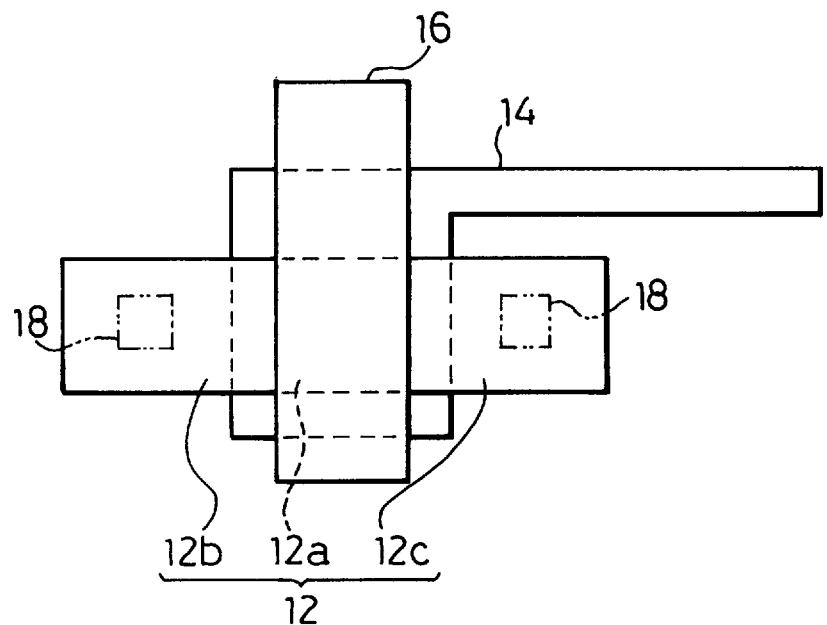
FIG. 2(*a*) is a plan view showing the layout of a conductive electrode, a polycrystal silicon thin-film and a gate electrode in the thin-film transistor of FIG. 1(*a*).

Here, in the transistor having the structure shown in FIG. 1(a), the conductive electrode 14 is preferably set to have at least the same width as the channel region 12a. In fact, however, the conductive electrode 14 is formed so as to have a width slightly wider than that of the channel region 12a, in order to maintain a margin required for a manufacturing process, as shown in FIG. 2(a).

In such a structure, since the area of the conductive electrode 14, which is located beneath the source region 12b and the drain region 12c, is small, the parasitic capacity that is generated between the conductive electrode 14 and the source region 12b as well as the drain region 12c is extremely small. Therefore, the circuit that is constituted of transistors having the above-mentioned structure can operate at high speeds, since it is hardly affected by the parasitic capacity.

Figure 2B:
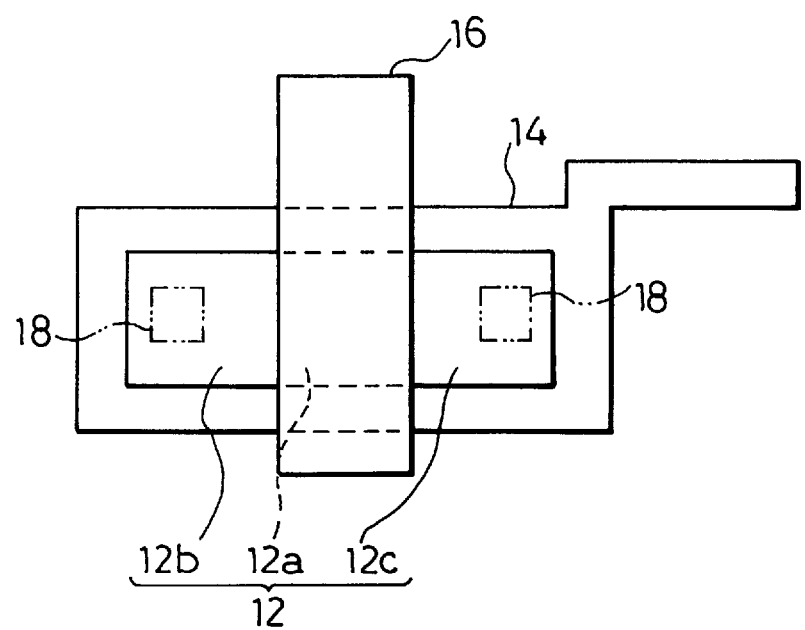

Here, in another transistor which has a structure as illustrated in FIG. 1(b), a conductive electrode 14 is provided beneath a p-Si thin-film 12 with a width wider than that of the p-Si thin-film 12, as illustrated in FIG. 2(b).

In this transistor, different from the transistor of FIG. 1(a) wherein the source region 12b and the drain region 12c are formed with a step difference from each other, a source region 12b and a drain region 12c of the p-Si thin-film 12 are formed in a flat fashion. With this structure, even during manufacturing processes (especially, during a crystallizing process of the p-Si thin-film 12), no adverse effects, such as a change in light reflectivity, are caused due to the base step difference (which will be described later) and the conductive electrode 14; therefore, it is possible to prevent such adverse effects that might impair produced transistors.

In a structure wherein the conductive electrode 14 is placed with only one portion thereof facing an active layer (for example, the p-Si thin-film 12), during a process for forming (for depositing) the active layer on the conductive electrode 14, a step-difference is produced on the active layer along the side edge of the conductive electrode 14, and the film thickness of the active layer becomes thinner at the step difference portion. As a result, during a crystallizing process of the active layer, the crystallizability in the vicinity of the step difference portion tends to be different (inferior to) from the crystallizability in the other portions; this increases the possibility of high resistivity between the source region and the drain region.

Further, since the cross-sectional area of the active layer becomes smaller due to the thinness of the film at the step difference portion, the resistance of the source region and the resistance of the drain region are more likely to be increased. This might cause a reduction in ON-state current in the transistor.

Moreover, the degradation in crystallizability in the periphery of the step difference portion might give adverse effects on the channel region 12a. In this case, the characteristics of the transistor, such as the threshold voltage and the carrier mobility, might be reduced.

Therefore, if there is no step difference on the active layer, such adverse effects will not appear in the transistor.

Here, with respect to the above-mentioned two structures of transistors, selection is appropriately made in accordance with required performance of the transistors. Further, these structures are also applied to the other embodiments which will be described later.

In the present embodiment, the polycrystal silicon thin-film transistor has a stagger construction wherein the conductive electrode 14 is placed beneath the p-Si thin-film 12. Since the position of the conductive electrode 14 is relatively determined in relation to the position of the gate electrode 16, it differs depending on the construction. In polycrystal silicon thin-film transistors of a reversed stagger construction, since the gate electrode is formed on the insulating substrate, the conductive electrode is placed on an active layer that is formed on the gate electrode.

The above-mentioned two positions of the conductive electrode are also applied to the other embodiments which will be described below.

[Embodiment 2]

Figure 5:
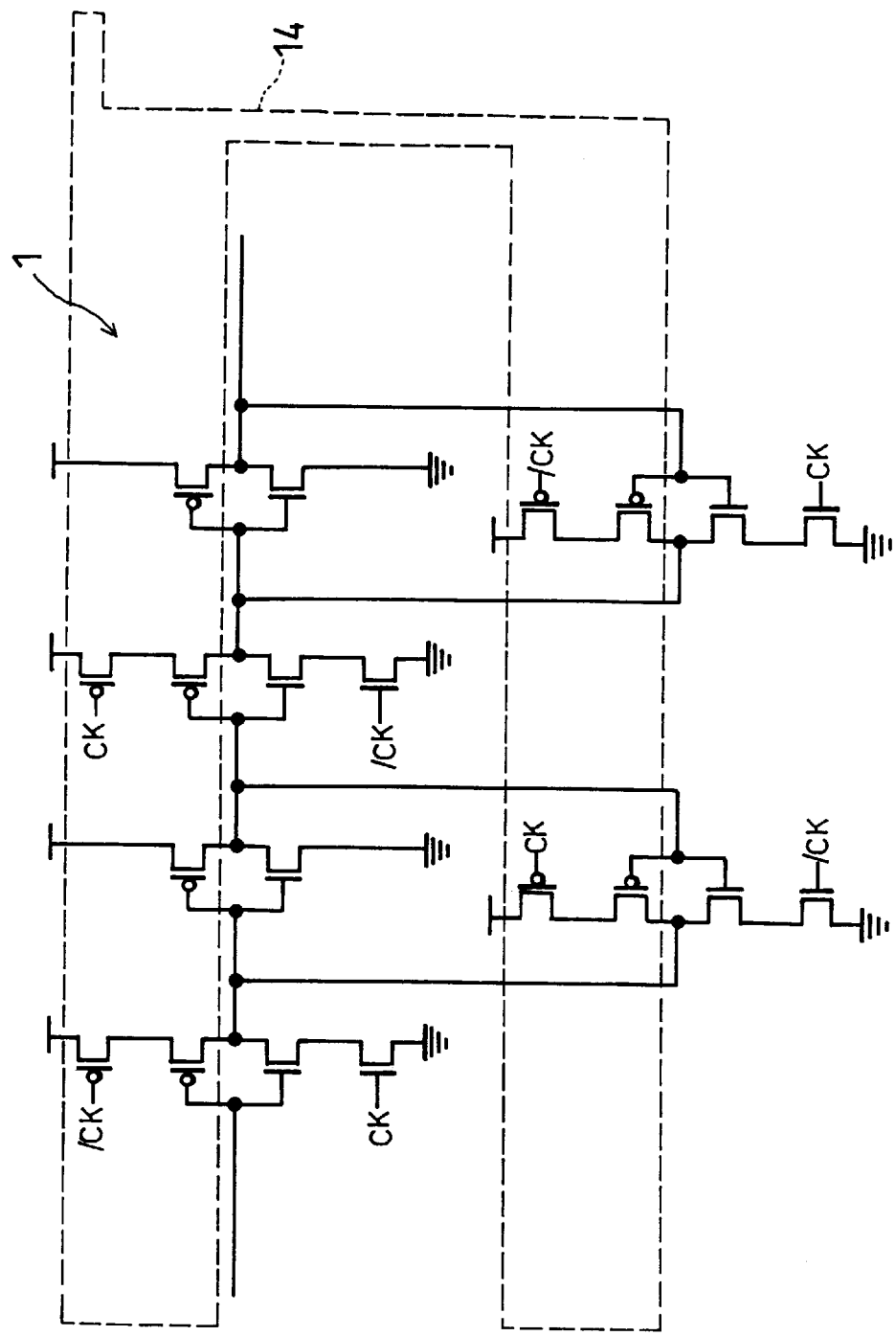
FIG. 5 is a circuit diagram showing a construction of a shift register that is formed by the thin-film transistor circuits of the second embodiment of the present invention, and that has the conductive electrodes installed only in its pch transistors.
Figure 6:
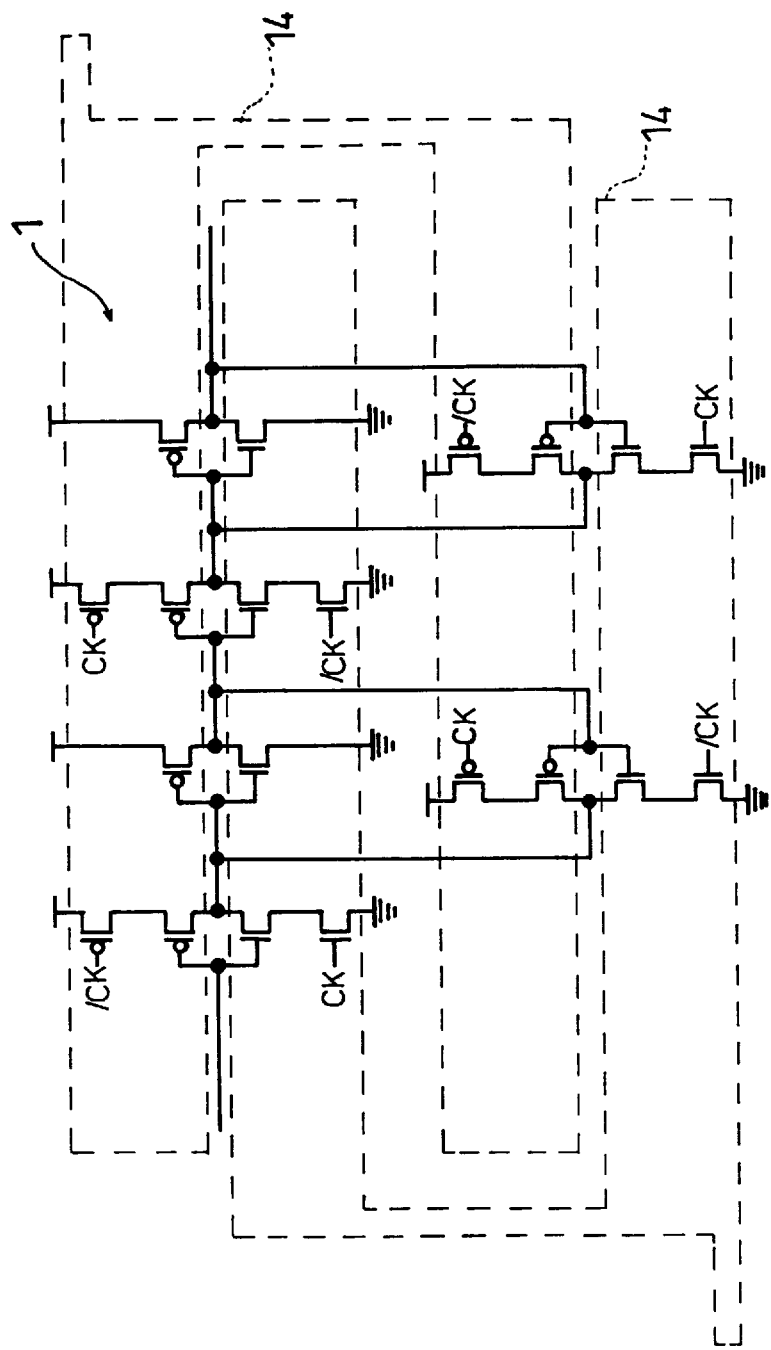
FIG. 6 is a circuit diagram showing a construction of a shift register that is formed by the thin-film transistor circuits of the second embodiment of the present invention, and that has the conductive electrodes installed in nch-transistors and in pch-transistors in a discrete manner.

Referring to FIGS. 1 and 2 as well as FIGS. 5 and 6, the following description will discuss the second embodiment of the present invention. Here, in the present embodiment and the third through seventh embodiments that will be described later, those components that have the same functions as those described in the aforementioned first embodiment are indicated by the same reference numerals and the description thereof is omitted.

As illustrated in FIG. 5, in a thin-film transistor circuit of the present embodiment, the conductive electrode 14 is attached to only pch transistors among transistors that constitute a shift register 1. In the same manner as the transistors of the aforementioned first embodiment, the conductive electrode 14 is placed below the p-Si thin-film 12 with the insulating film 13 located in between, as shown in FIGS. 1(a) and 2(a) as well as FIGS. 1(b) and 2(b).

With this arrangement, it is possible to shift the threshold voltage of only the pch transistors for the same reasons as described in the first embodiment. The arrangement is effectively applied to a case where the threshold voltage of pch transistors is offset from a desired value by a great degree, where the threshold voltage of nch-transistors is held at a desired value.

Moreover, as illustrated in FIG. 6, in another thin-film transistor circuit of the present embodiment, the conductive electrode 14 is also attached to the nch-transistors in a discrete manner from the pch-transistors.

In this arrangement, it is possible to shift the threshold voltage of the nch-transistors and the threshold voltage of the pch-transistors independently, by applying different constant voltages to the respective conductive electrodes 14. This arrangement is effectively applied to a case where the threshold voltage of nch-transistors and the threshold voltage of pch-transistors are offset from respective desired values by great degrees, and are to be shifted by different voltage values respectively.

[Embodiment 3]

Referring to FIGS. 1, 2, 7, 8, and 9, the following description will discuss the third embodiment of the present invention.

Figure 7:
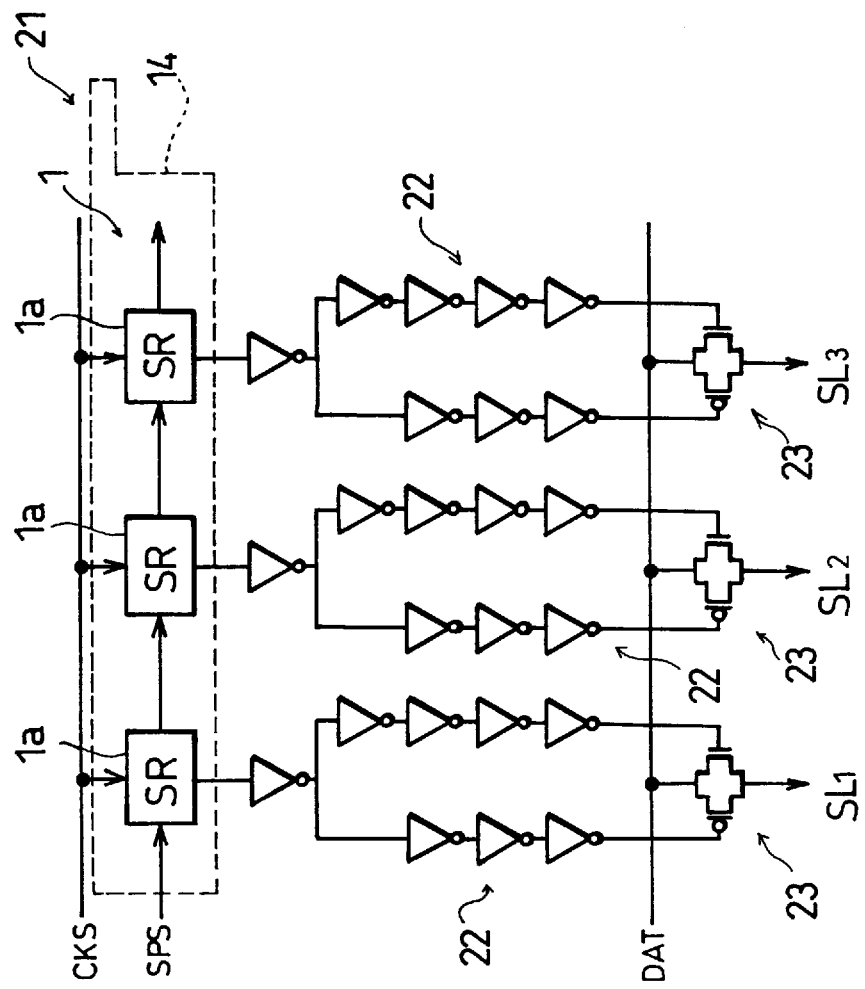
FIG. 7 is a circuit diagram showing a construction of a data-signal-line driving circuit that is formed by the thin-film transistor circuits of the third embodiment of the present invention, and that has the conductive electrodes installed only in its shift registers.
Figure 8:
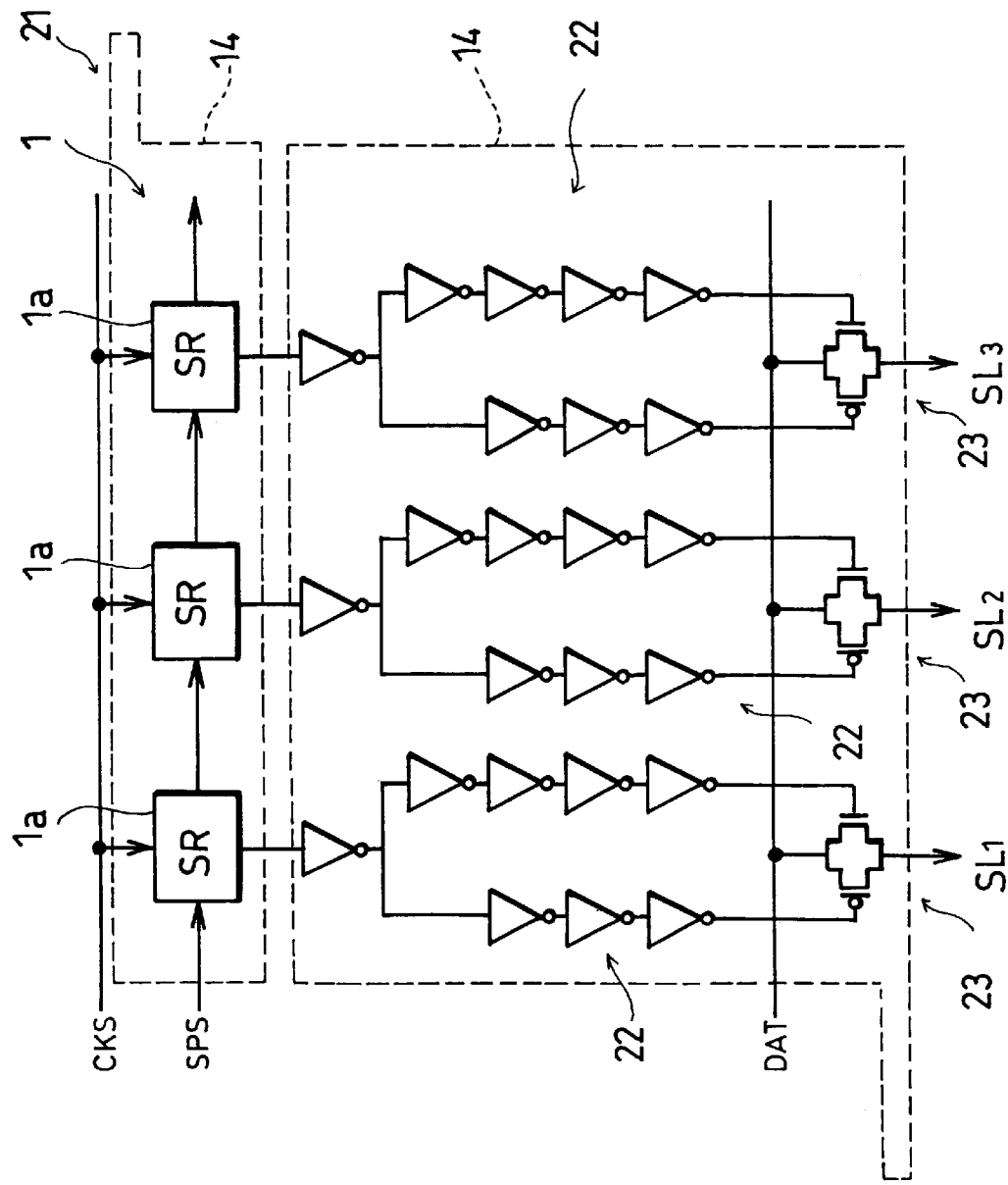
FIG. 8 is a circuit diagram showing a construction of a data-signal-line driving circuit that is formed by the thin-film transistor circuits of the third embodiment of the present invention, and that is provided with the conductive electrodes that are installed in its shift registers and in the other circuits in a discrete manner.

As illustrated in FIGS. 7 and 8, a thin-film transistor circuit of the present embodiment is a data-signal-line driving circuit 21 that is used in an image display of the active-matrix driving system.

In the data-signal-line driving circuit 21, respective units 1a (indicated by SR in the drawing), which constitute a shift register 1, are designed to shift a start pulse SPS in synchronism with a synchronous signal CKS in a sequential manner. Pulses released from the respective units 1a are fed to sampling circuits 23 through buffer circuits 22.

Each buffer circuit 22 is provided with two branches of signal transmitting paths each of which has inverters the number of which is different from the other. Pulses, each having the polarity different from the other, are released from the respective signal transmitting paths. Each sampling circuit 23 conducts when the pulses from the two signal transmitting paths are fed to the respective gate electrodes of the nch-transistors and the pch-transistors, and thus outputs a video signal DAT to each of the data signal lines $SL_1$, $SL_2$, $SL_3$ . . . , etc.

Among all the transistors that constitute the data-signal-line driving circuit 21, those transistors that constitute the units 1a have a short channel length L (L=6 μm) since the shift register 1 is required to operate at high speeds. Further, those transistors that constitute the buffer circuits 22 in the data-signal-line driving circuit 21 have a long channel length L (L=8 μm) since, different from the shift registers 1, they are not required to operate at high speeds. Moreover, those transistors that constitute the sampling circuits 23 have a still longer channel length L (L=10 μm) in order to reduce leakage currents.

Here, in the data-signal-line driving circuit 21, as illustrated in FIG. 7, the conductive electrode 14 is only attached to the transistors constituting the units 1a, that is, to the transistors that have the shortest channel length (L=6 μm). As illustrated in FIGS. 1(a) and 2(a) as well as FIGS. 1(b) and 2(b), the conductive electrode 14 is placed below the p-Si thin-film 12 with the insulating film 13 located in between.

With this arrangement, it is possible to shift the threshold voltage of only the transistors that have the short channel length for the same reasons as described in the first embodiment.

Moreover, as illustrated in FIG. 8, in another thin-film transistor circuit of the present embodiment, the conductive electrodes 14 are respectively attached not only to the transistors constituting the shift registers 1, but also to the transistors constituting the buffer circuits 22 and the transistors constituting the sampling circuits 23 both of which have longer channel lengths, in a discrete manner.

In this arrangement, it is possible to shift not only the threshold voltage of the transistors in the shift registers 1, but also the threshold voltage of the transistors constituting the buffer circuits 22 and the sampling circuits 23 independently, by applying different constant voltages to the respective conductive electrodes 14.

Figure 9:
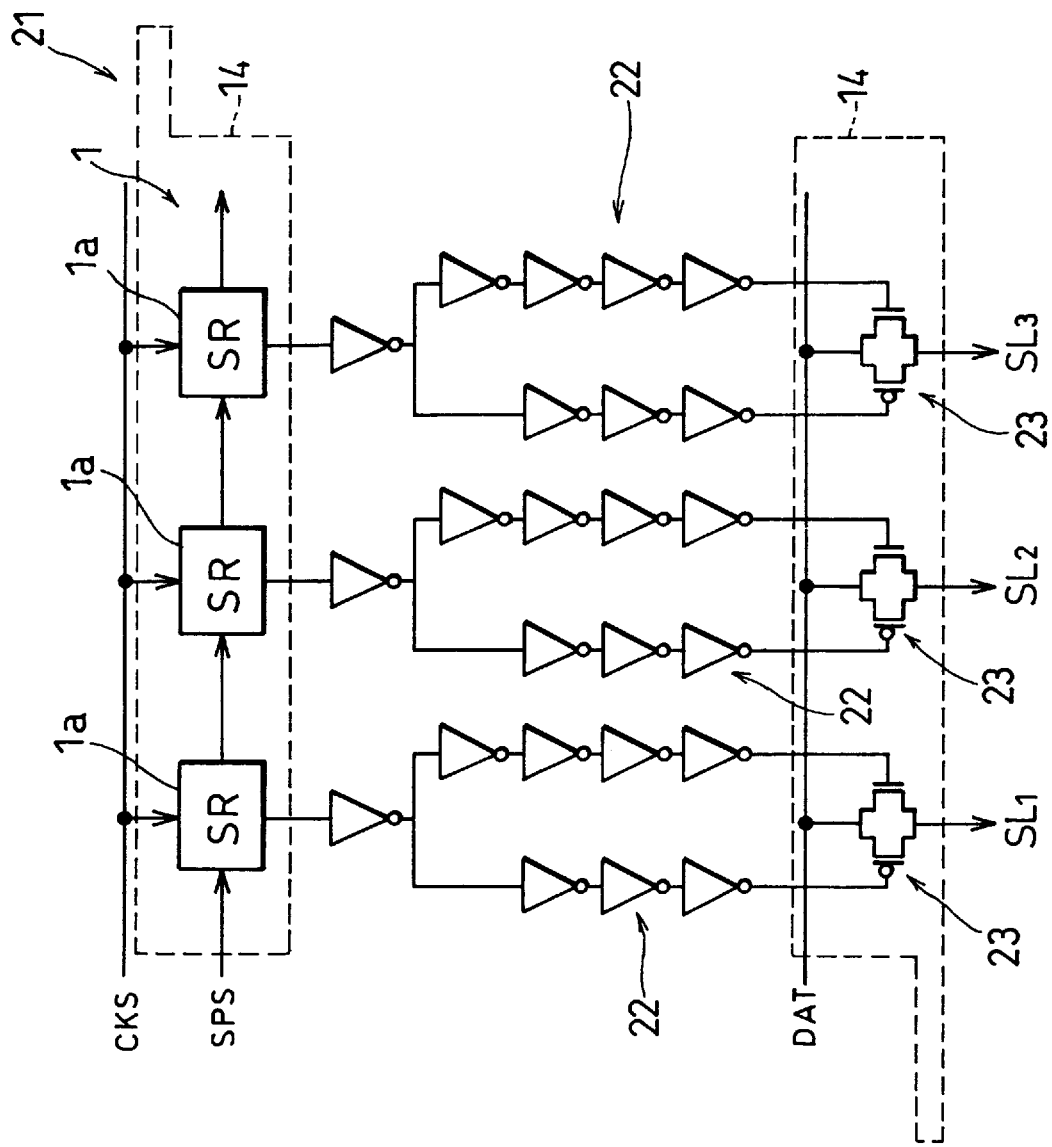
FIG. 9 is a circuit diagram showing a construction of a data-signal-line driving circuit that is formed by the thin-film transistor circuits of the third embodiment of the present invention, and that is provided with the conductive electrodes that are installed in its shift registers and in its sampling circuits in a discrete manner.

Further, in another thin-film transistor circuit of the present embodiment, as illustrated in FIG. 9, the conductive electrodes 14 are respectively attached not only to the transistors constituting the shift registers 1, but also to the transistors constituting the sampling circuits 23 that have the longest channel length in a discrete manner. Here, no conductive electrode 14 is attached to the transistors constituting the buffer circuits 22.

In this arrangement, it is possible to shift not only the threshold voltage of the transistors in the shift registers 1, but also the threshold voltage of transistors in the sampling circuits 23 independently, by applying different constant voltages to the respective conductive electrodes 14. In this case, with respect to the transistors constituting the buffer circuits 22 that have no conductive electrode 14, the threshold voltage thereof is not shifted.

Since there are some cases wherein the threshold voltages become different depending on the channel lengths due to the short channel effect and other effects, the above-mentioned three structures are effectively applied particularly to such cases where the threshold voltages are offset from desired values by great degrees depending on the channel lengths.

[Embodiment 4]

Referring to FIGS. 1, 2, 10, 11, and 12, the following description will discuss the fourth embodiment of the present invention.

Figure 10:
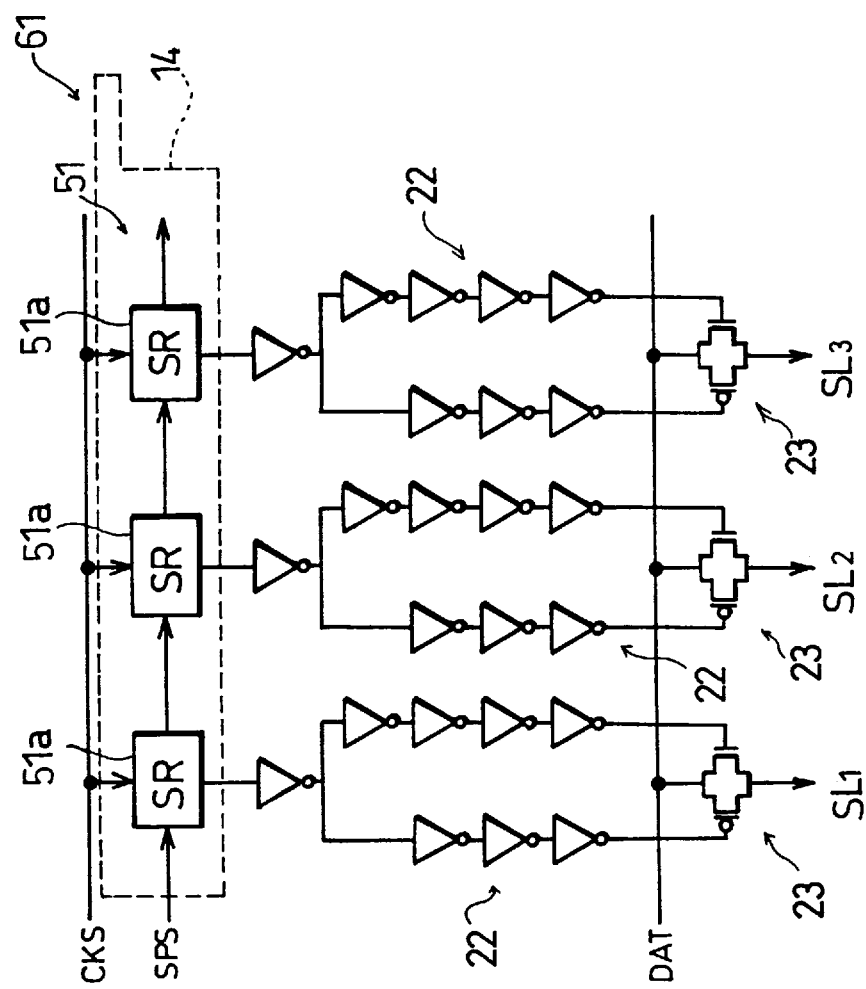
FIG. 10 is a circuit diagram showing a construction of a data-signal-line driving circuit that is formed by the thin-film transistor circuits of the fourth embodiment of the present invention, and that has the conductive electrodes installed only in its dynamic-type shift registers.
Figure 11:
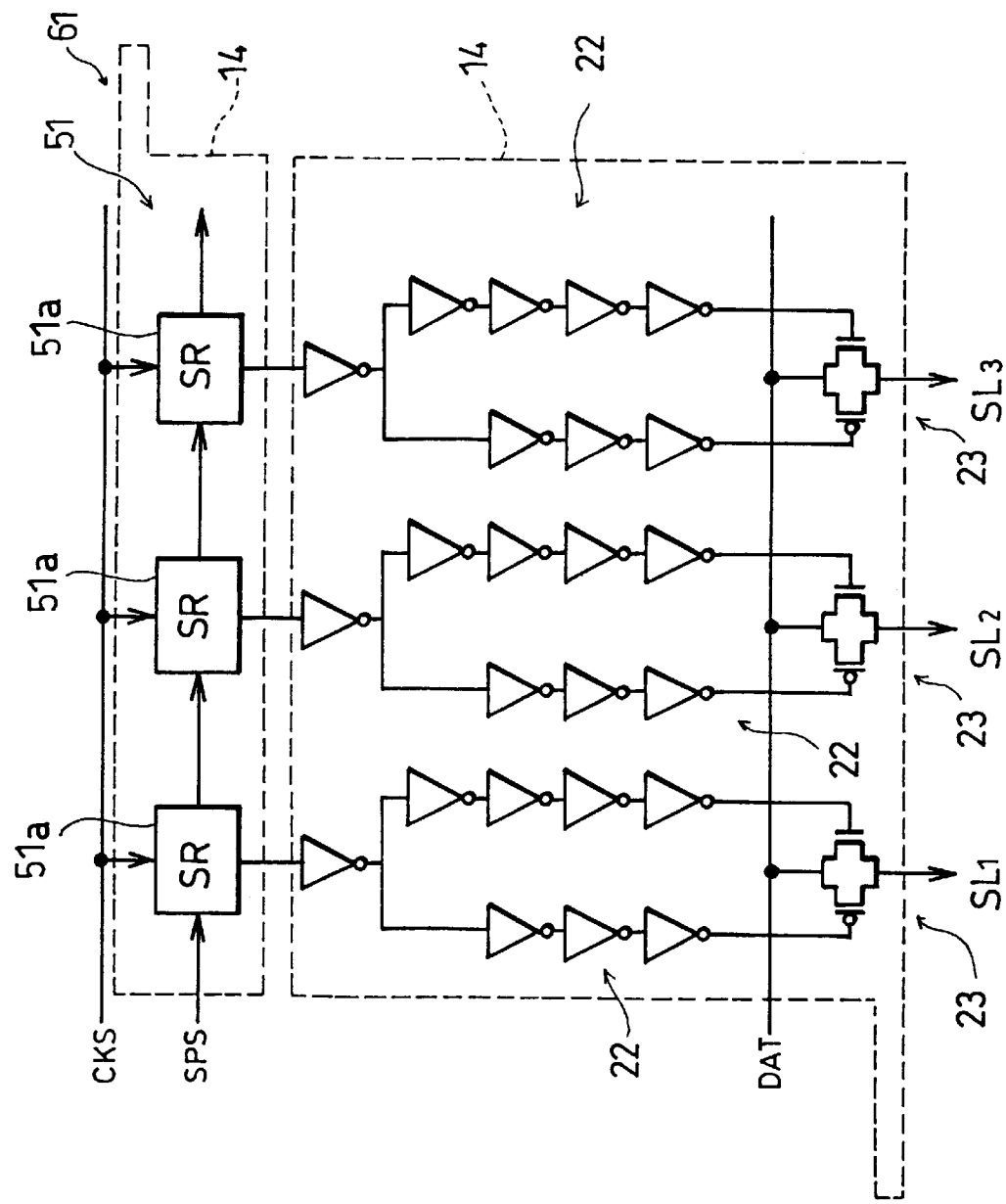
FIG. 11 is a circuit diagram showing a construction of a data-signal-line driving circuit that is formed by the thin-film transistor circuits of the fourth embodiment of the present invention, and that is provided with the conductive electrodes that are installed in its dynamic-type shift registers and in the other circuits in a discrete manner.

As illustrated in FIGS. 10 and 11, a thin-film transistor circuit of the present embodiment is a data-signal-line driving circuit 61 that is used in an image display of the active-matrix driving system.

This data-signal-line driving circuit 61 has almost the same construction as that of the data-signal-line driving circuit 21 described in the third embodiment, but is different therefrom in that a dynamic-type shift register 51 is installed.

Figure 12:
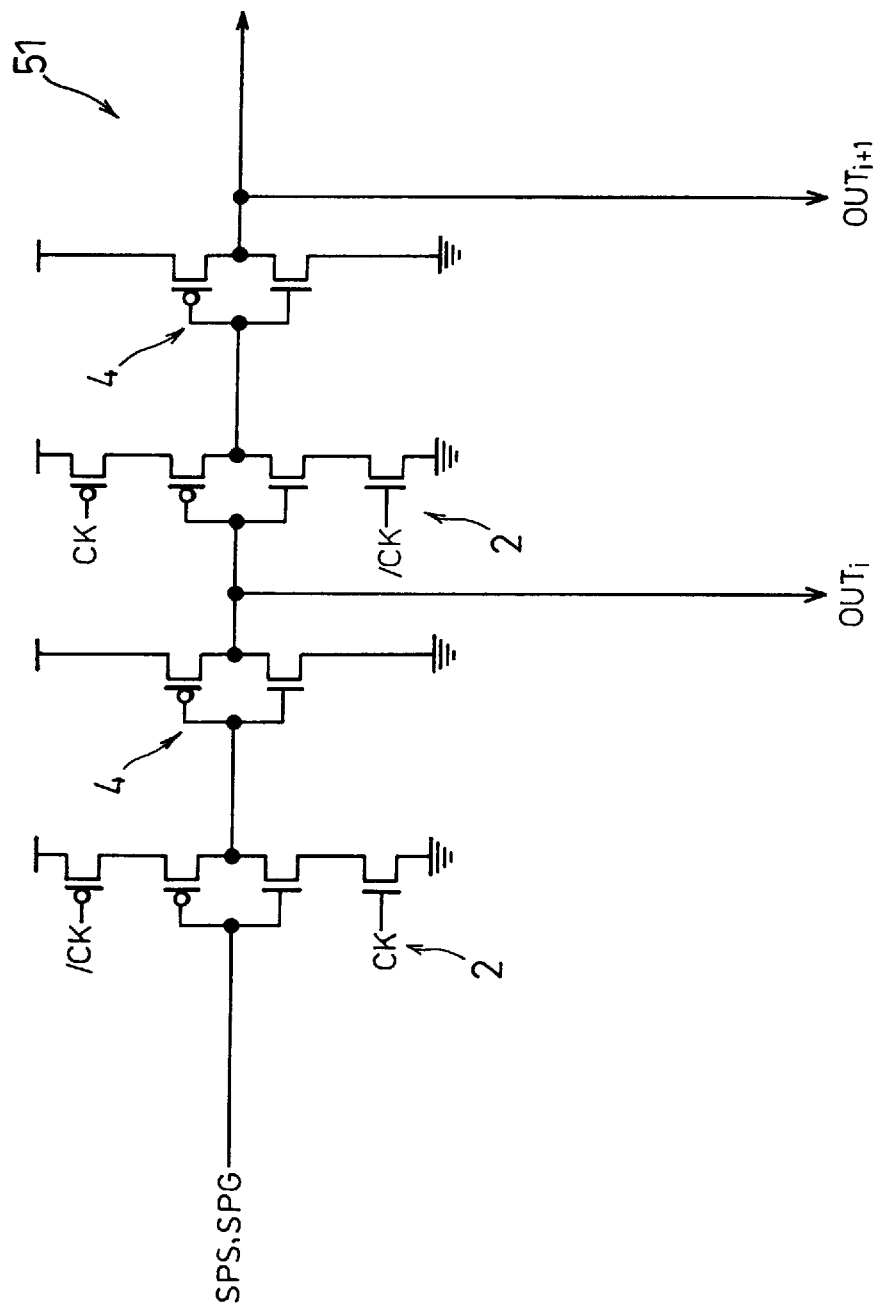
FIG. 12 is a circuit diagram showing a construction of the dynamic-type shift register that is constituted of the thin-film transistor circuits of the fourth embodiment of the present invention.

FIG. 12 shows a construction corresponding to two units of the shift register 51. The shift register 51 is provided with two clocked inverters 2 and one inverter 4 per one unit. The clocked inverter 2 and the inverter 4 are arranged in series with each other on a transferring line of a start pulse SPS. Here, the output of the inverter 4 forms outputs $OUT_i$ and $OUT_{i+1}$ of the respective units in the shift register 51, and pulses that have been shifted by the respective units are thus obtained.

In the data-signal-line driving circuit 61, respective units 51a (indicated by SR in the drawing), which constitute a shift register 51, are designed to shift a start pulse SPS in synchronism with a synchronous signal CKS in a sequential manner. Pulses released from the respective units 51a are fed to sampling circuits 23 through buffer circuits 22.

Among all the transistors constituting the data-signal-line driving circuit 61, those transistors constituting the units 51a have to be designed to suppress the leakage current so that the shift register 51 properly operates. In contrast, for other static circuits such as the buffer circuits 22 and the sampling circuits 23, it is preferable to provide a high driving power.

In the above-mentioned data-signal-line driving circuit 61, as illustrated in FIG. 10, the conductive electrode 14 is attached only to the transistors constituting the units 51a, that is, the transistors that have to be designed to suppress the leakage current. As illustrated in FIGS. 1(a) and 2(a) or FIGS. 1(b) and 2(b), the conductive electrode 14 is placed below the p-Si thin-film 12 with the insulating film 13 located in between.

With this arrangement, it is possible to shift the threshold voltage of only the transistors that constitute a dynamic circuit for the same reasons as described in the first embodiment.

Moreover, as illustrated in FIG. 11, in another thin-film transistor circuit of the present embodiment, the conductive electrodes 14 are also attached to the transistors constituting static circuits, such as the buffer circuits 22 and the sampling circuits 23 other than the shift registers 51, independently from the transistors constituting the shift registers 51.

In this arrangement, it is possible to respectively shift not only the threshold voltage of the transistors in the shift registers 51 that serve as dynamic circuits, but also the threshold voltage of the transistors constituting the buffer circuits 22 and the sampling circuits 23 that serve as static circuits in a discrete manner, by applying different constant voltages to the respective conductive electrodes 14.

The above-mentioned two structures are effectively applied to such a case where, when dynamic circuits and static circuits coexist in the same substrate, the threshold voltages of the transistors constituting the respective circuits are offset from desired values by great degrees.

[Embodiment 5]

Referring to FIGS. 1, 2, 13, 14, and 15, the following description will discuss the fifth embodiment of the present invention.

Figure 13:
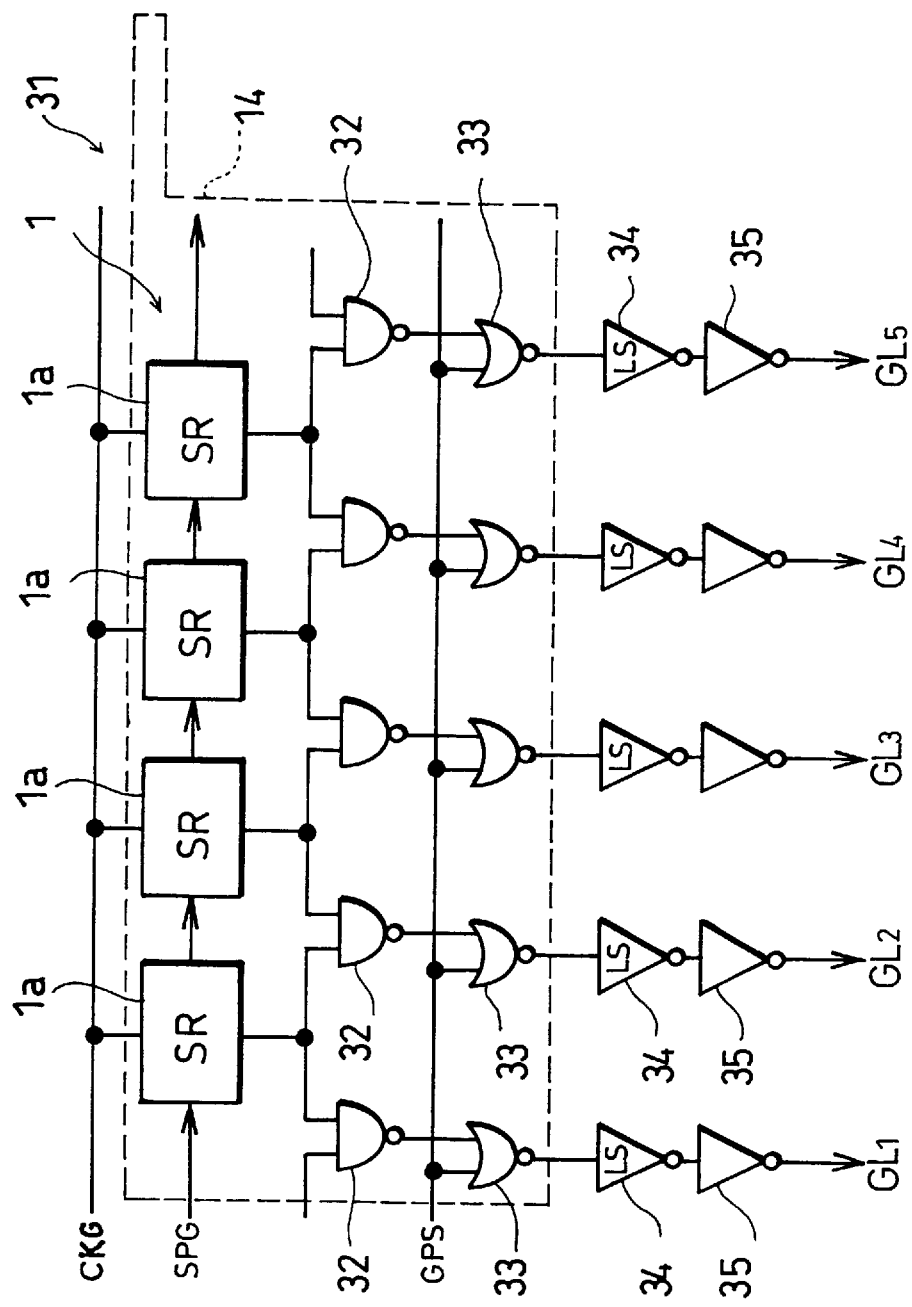
FIG. 13 is a circuit diagram showing a construction of a scanning-signal-line driving circuit which is constituted of the thin-film transistor circuits of the fifth embodiment of the present invention, and in which the conductive electrodes are installed only in circuits located before the level shifters.
Figure 14:
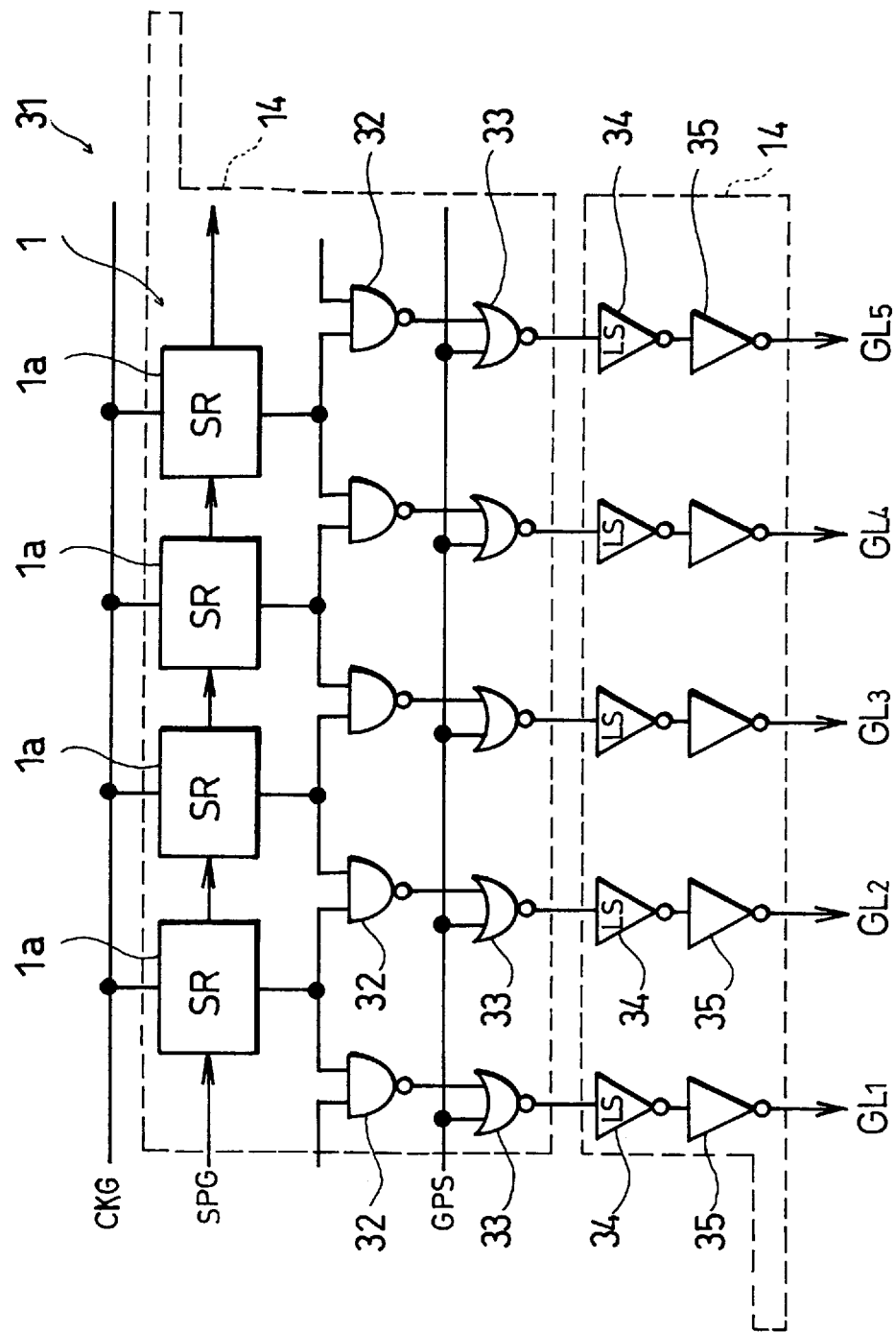
FIG. 14 is a circuit diagram showing a construction of a scanning-signal-line driving circuit which is constituted of the thin-film transistor circuits of the fifth embodiment of the present invention, and in which the conductive electrodes are installed in circuits located before the level shifters and in circuits located after the level shifters in a discrete manner.

As illustrated in FIGS. 13 and 14, a thin-film transistor circuit of the present embodiment is a scanning-signal-line driving circuit 31 that is used in an image display of the active-matrix driving system.

In the scanning-signal-line driving circuit 31, a plurality of units 1a, which constitute a shift register 1, are designed to shift a start pulse SPG in synchronism with a synchronous signal CKG in a sequential manner. NAND gates 32, which are installed at the following stage of the units 1a, carry out the logical NAND between the two pulses that are outputted from the adjacent units 1a and 1a. Further, NOR gates 33, which are installed at the following stage of the NAND gates 32, carry out the logical NOR between the output from each NAND gate 32 and the synchronous signal GPS.

At the following stage of the NOR gates 33, level shifters 34 and buffers 35 are successively installed. The outputs of the NOR gates 33 are fed as scanning signals to scanning signal lines $GL_1$, $GL_2$, $GL_3$ . . . , etc. through the level shifters 34 and buffers 35.

Moreover, source voltages $V_{GH1}$ (high potential) and $V_{GL1}$ (low potential) are applied as driving voltages to a group of circuits that require relatively low voltages and that consist of the shift registers 1, the NAND gates 32, the NOR gates 33 and other circuits. On the other hand, source voltages $V_{GH2}$ (high potential) and $V_{GL2}$ (low potential) are applied to as driving voltages to a group of circuits that require relatively high voltages and that consist of the level shifters 34, buffers 35 and other circuits.

In the above-mentioned scanning-signal-line driving circuit 31, as illustrated in FIG. 13, the conductive electrode 14 is attached only to the transistors constituting the circuits that are located at the preceding stages of the level shifters 34 and that include the shift registers 1, the NAND gates 32, the NOR gates 33 and other circuits. As illustrated in FIGS. 1(a) and 2(a) or FIGS. 1(b) and 2(b), the conductive electrode 14 is placed below the p-Si thin-film 12.

With this arrangement, it is possible to shift the threshold voltage of only the transistors that constitute the circuits at the preceding stages of the level shifters 34 for the same reasons as described in the first embodiment. The above-mentioned arrangement is effective when a low threshold voltage, which is required by the transistors that are located at the preceding stages of the level shifters 34 and that require relatively low driving voltages, is to be obtained.

Moreover, as illustrated in FIG. 14, in another thin-film transistor circuit of the present embodiment, the conductive electrode 14 is also attached to the transistors constituting the circuits including the level shifters 34 and the buffers 35 and other circuits at the following stages, in a discrete manner from the transistors constituting the circuits at the preceding stages from the level shifters 34.

In this arrangement, it is possible to shift the threshold voltage of the transistors constituting the circuits at the preceding stages from the level shifters 34 as well as the threshold voltage of the transistors constituting the circuits including the level shifters 34 and other circuits at the following stage independently, by applying different constant voltages to the respective conductive electrodes 14. This arrangement is effective when threshold voltages that are required by the respective groups of circuits are to be obtained.

Figure 15:
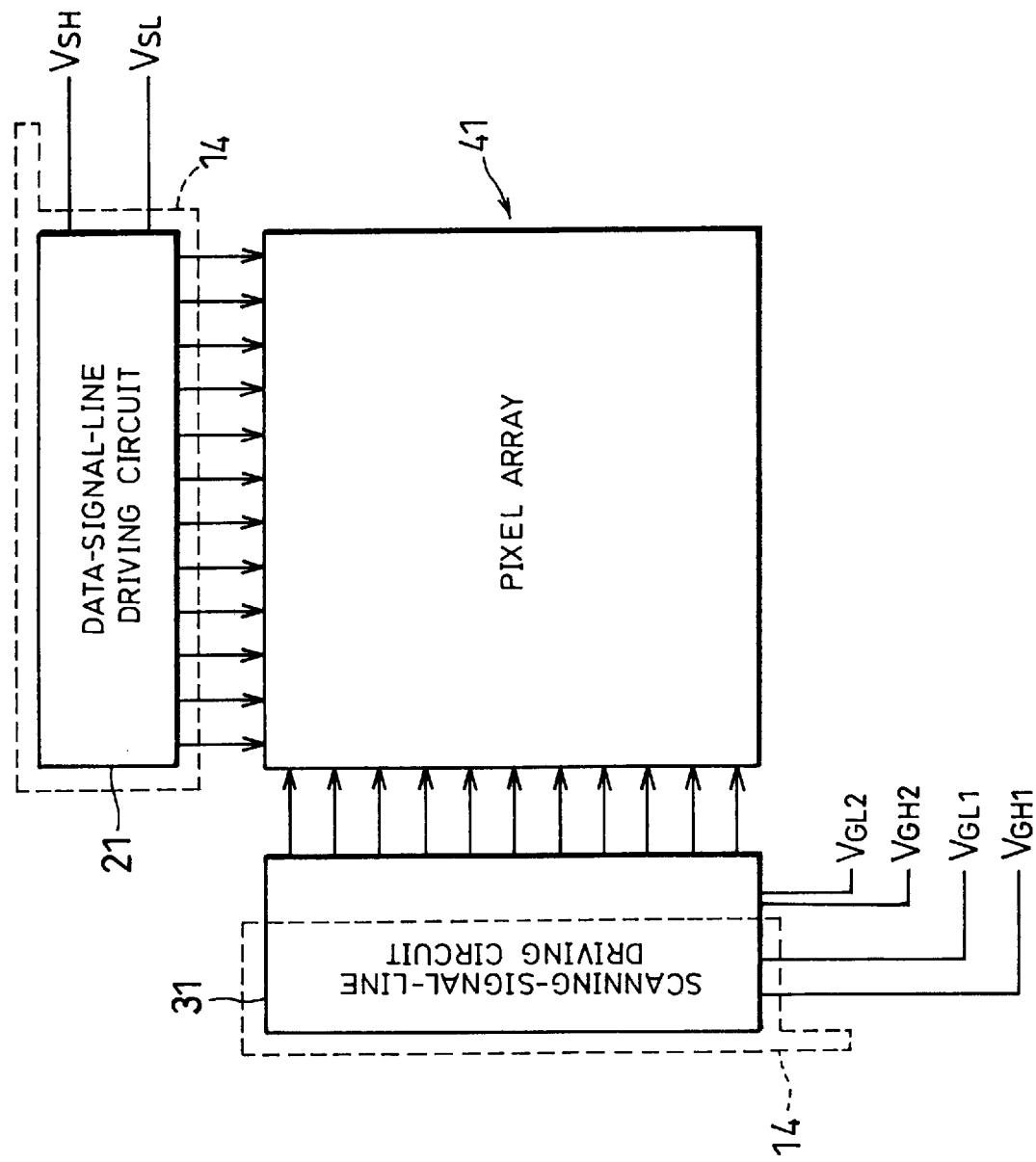
FIG. 15 is a block diagram showing a construction of a essential part of an image display having the scanning-line-driving circuit of FIG. 13.

The thin-film transistor circuit, shown in FIG. 13, is incorporated into an image display as the scanning-signal-line driving circuit 31, as shown in FIG. 15. In this image display, the data-signal-line driving circuit 21 is constituted of, for example, the circuit described in the aforementioned third embodiment (see FIG. 8). The data-signal-line driving circuit 21 and the scanning-signal-line driving circuit 31 are connected to a pixel array 41.

In this case, source voltages, which are respectively applied to the data-signal-line driving circuit 21 and the scanning-signal-line driving circuit 31, are different from each other. Source voltages $V_{SH}$ (high potential) and $V_{SL}$ (low potential) are applied to the data-signal-line driving circuit 21 as driving voltages. On the other hand, in the scanning-signal-line driving circuit 31, source voltages $V_{GH1}$ (high potential) and $V_{GL1}$ (low potential) are applied to one group of circuits that require relatively high driving voltages and source voltages $V_{GH2}$ (high potential) and $V_{GL2}$ (low potential) are applied to the other group of circuits that require relatively low driving voltages, as described earlier.

Here, although not shown in FIG. 15, the thin-film transistor circuit, shown in FIG. 14, is incorporated into the image display in the same manner as the thin-film transistor circuit shown in FIG. 13.

[Embodiment 6]

Figure 16:
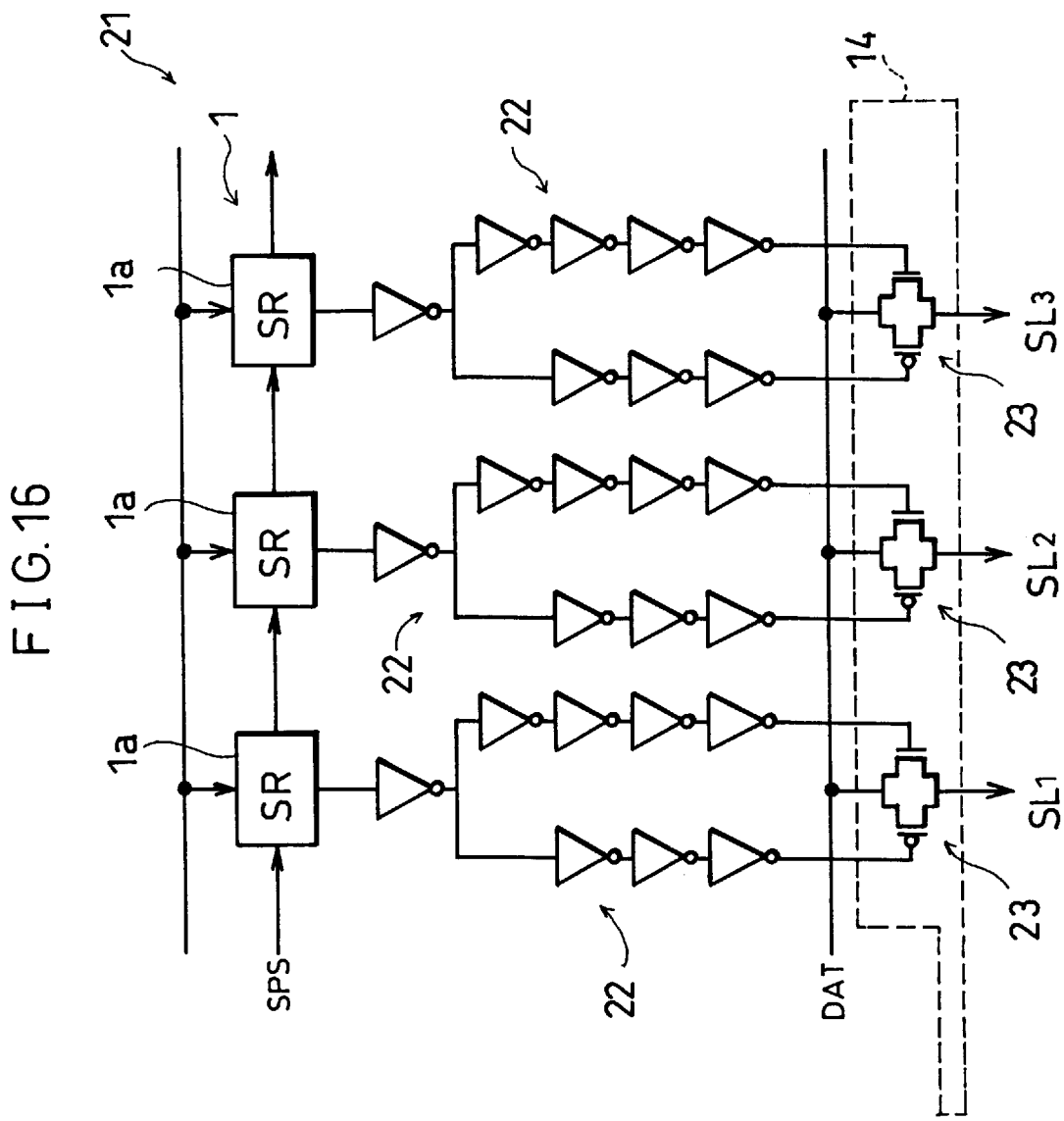
FIG. 16 is a circuit diagram showing a construction of a data-signal-line driving circuit that is formed by the thin-film transistor circuits of the sixth embodiment of the present invention, and that has the conductive electrodes installed only in its sampling circuits.
Figure 17:
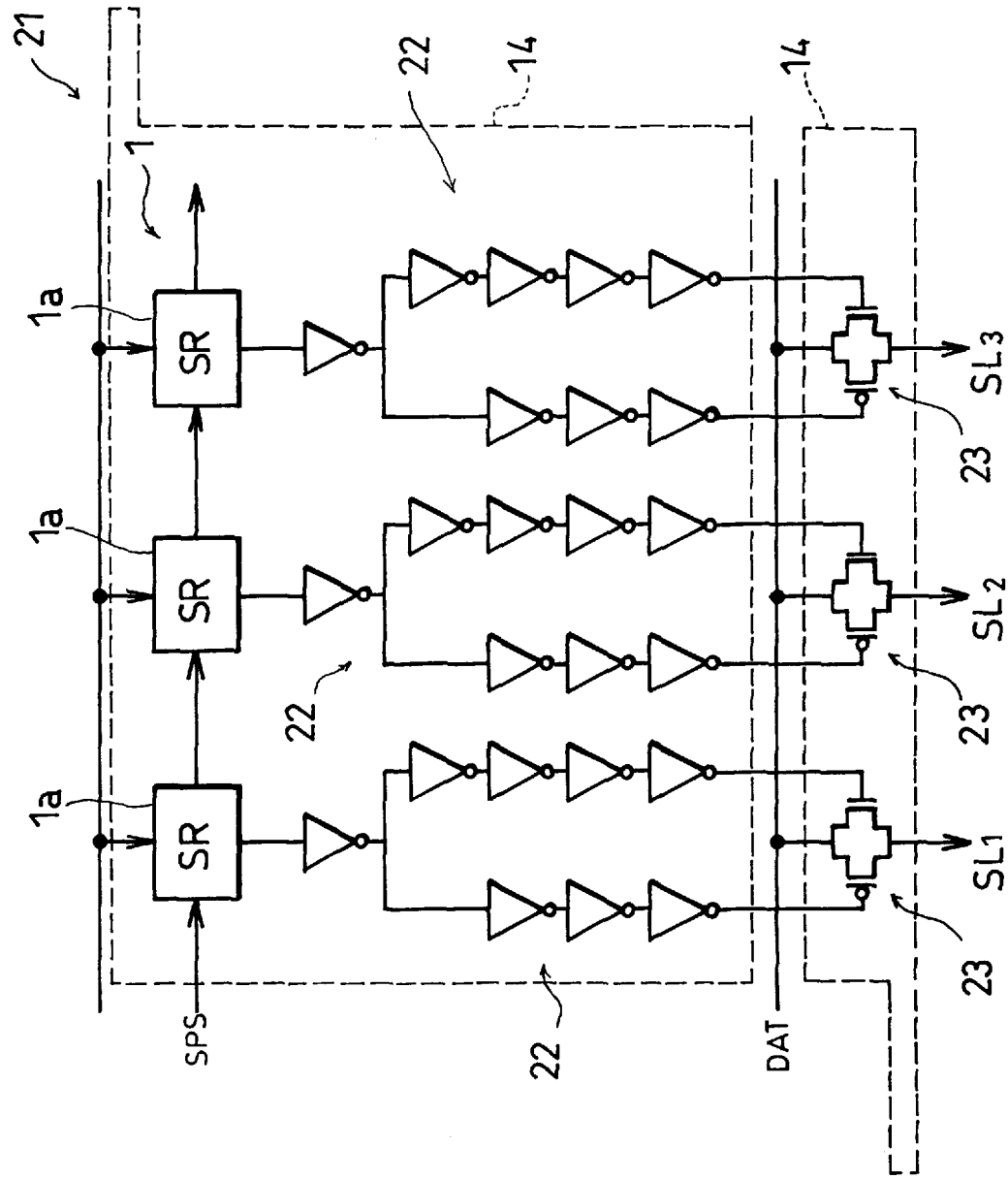
FIG. 17 is a circuit diagram showing a construction of a data-signal-line driving circuit that is formed by the thin-film transistor circuits of the sixth embodiment of the present invention, and that is provided with the conductive electrodes that are installed in its sampling circuits and in the other circuits in a discrete manner.

Referring to FIGS. 1 and 2 as well as FIGS. 16 and 17, the following description will discuss the sixth embodiment of the present invention. Here, in the present embodiment, those components that have the same functions as those described in the third embodiment are indicated by the same reference numerals and the description thereof is omitted.

As illustrated in FIG. 16, the thin-film transistor circuit of the present embodiment is a data-signal-line driving circuit 21 that is used in an image display of the active-matrix driving system. In the data-signal-line driving circuit 21, the conductive electrode 14 is attached to only transistors constituting sampling circuits 23 that are analog circuits. The conductive electrode 14 is placed below the p-Si thin-film 12, as shown in FIGS. 1(a) and 2(a) or FIGS. 1(b) and 2(b).

In this arrangement, it is possible to shift the threshold voltage of only the transistors constituting the sampling circuits 23 that are analog circuits for the same reasons as described in the first embodiment.

Moreover, as illustrated in FIG. 17, in another thin-film transistor circuit of the present embodiment, the conductive electrode 14 is also attached to the transistors constituting digital circuits, such as the shift registers 1 and the buffer circuits 22, other than the sampling circuits 23, in a discrete manner from the transistors constituting the analog circuits (the sampling circuits 23).

In this arrangement, it is possible to shift the threshold voltage of the transistors constituting the analog circuits (the sampling circuits 23) as well as the threshold voltage of the transistors constituting the digital circuits (circuits other than the sampling circuits 23) independently, by applying different constant voltages to the respective conductive electrodes 14.

With respect to transistors constituting analog circuits such as the sampling circuits 23 that require reduced leakage currents in order to process analog data and transistors constituting digital circuits such as the shift registers 1 that require high-speed operation in order to process digital data, the above-mentioned two arrangements are effectively used when provisions are made so as to provide threshold voltages that meet the respective requirements.

Additionally, various examples of thin-film transistor circuits have been discussed in the present embodiment and the aforementioned embodiments; however, as for combined arrangements among the thin-film transistor circuits of the respective embodiment, explanations thereof are omitted, since it is obvious for the properly combined arrangements among the respective thin-film transistor circuits to exhibit the same effects as those described in the respective embodiments. For example, another arrangement may be proposed wherein discrete conductive electrodes are attached only to n-channel-type thin-film transistors having channel lengths located within a certain range and to transistors constituting analog circuits to which driving voltages located within a certain range are applied, and discrete voltages are applied thereto respectively.

[Embodiment 7]

Referring to FIGS. 1 through 18, the following description will discuss the seventh embodiment of the present invention.

Figure 18:
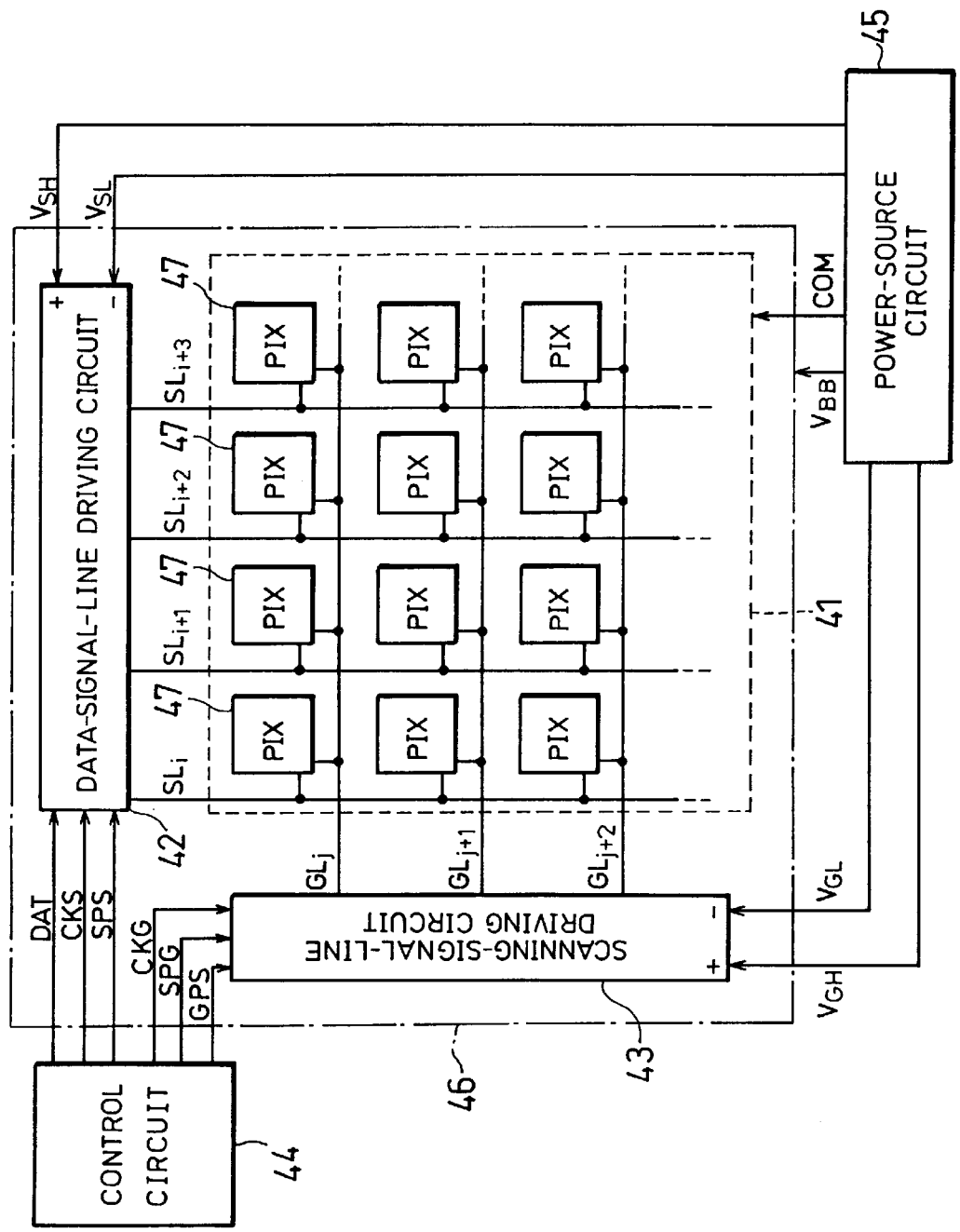
FIG. 18 is a block diagram showing a construction of an essential part of an image display of the seventh embodiment of the present invention.

As illustrated in FIG. 18, an image display of the present embodiment is provided with a pixel array 41, a data-signal-line driving circuit 42, a scanning-signal-line driving circuit 43, a control circuit 44 and a power-source circuit 45.

Figure 19A:
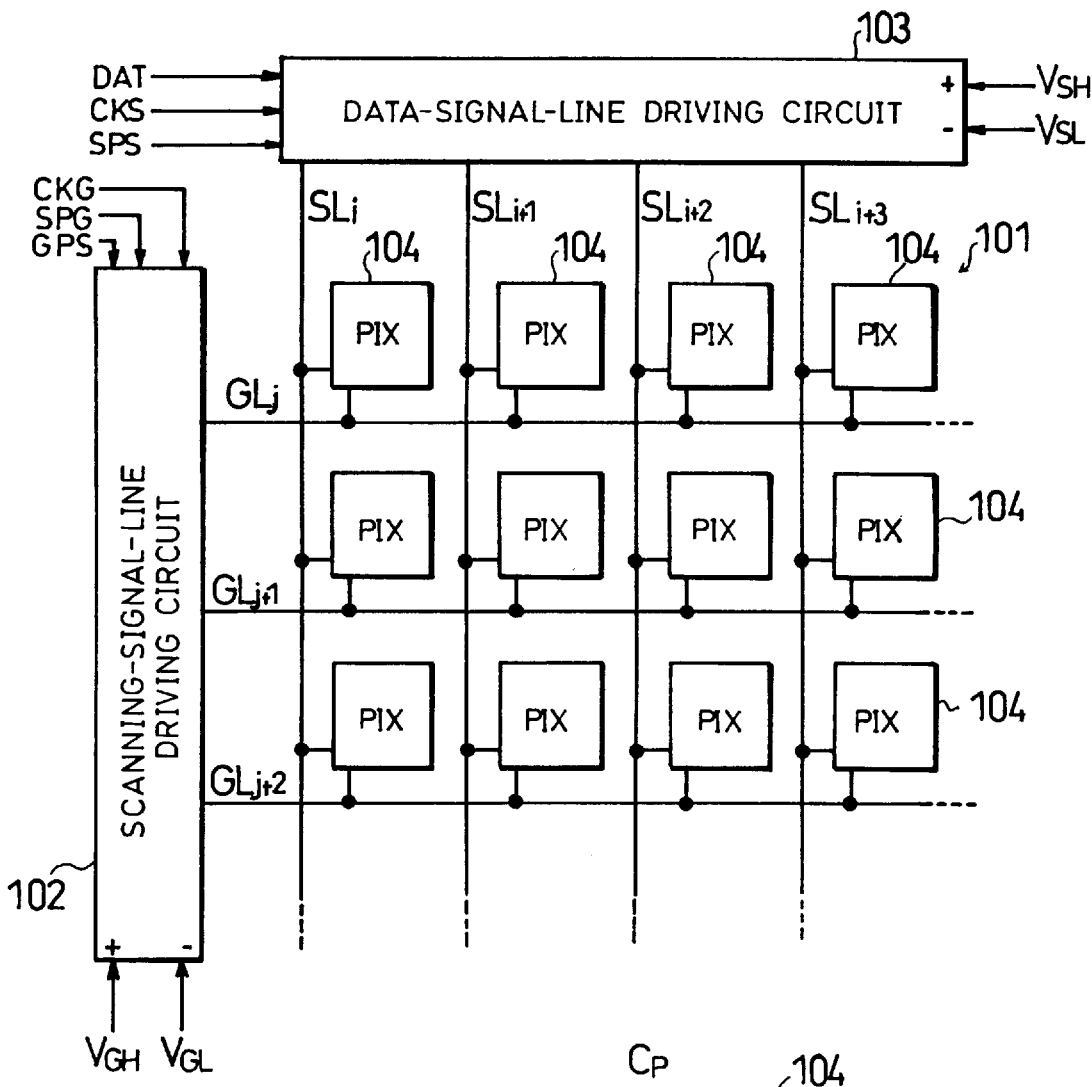
FIG. 19(a) is a block diagram showing a construction of an essential part of a conventional image display of the commonly-used active-matrix driving system.
Figure 19B:
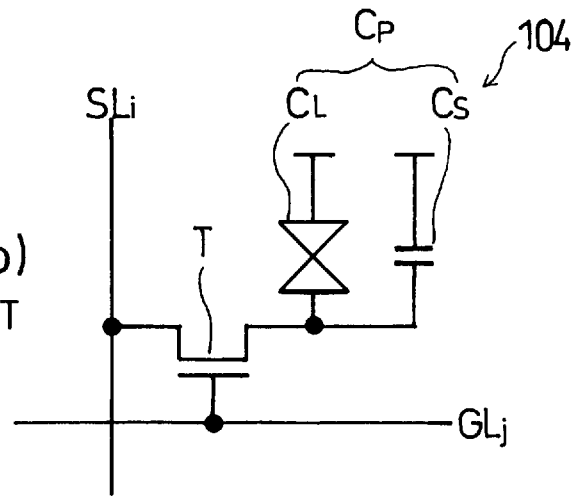
FIG. 19(b) is a circuit diagram showing an enlarged construction of each pixel in the image display of FIG. 19(a).
Figure 20:
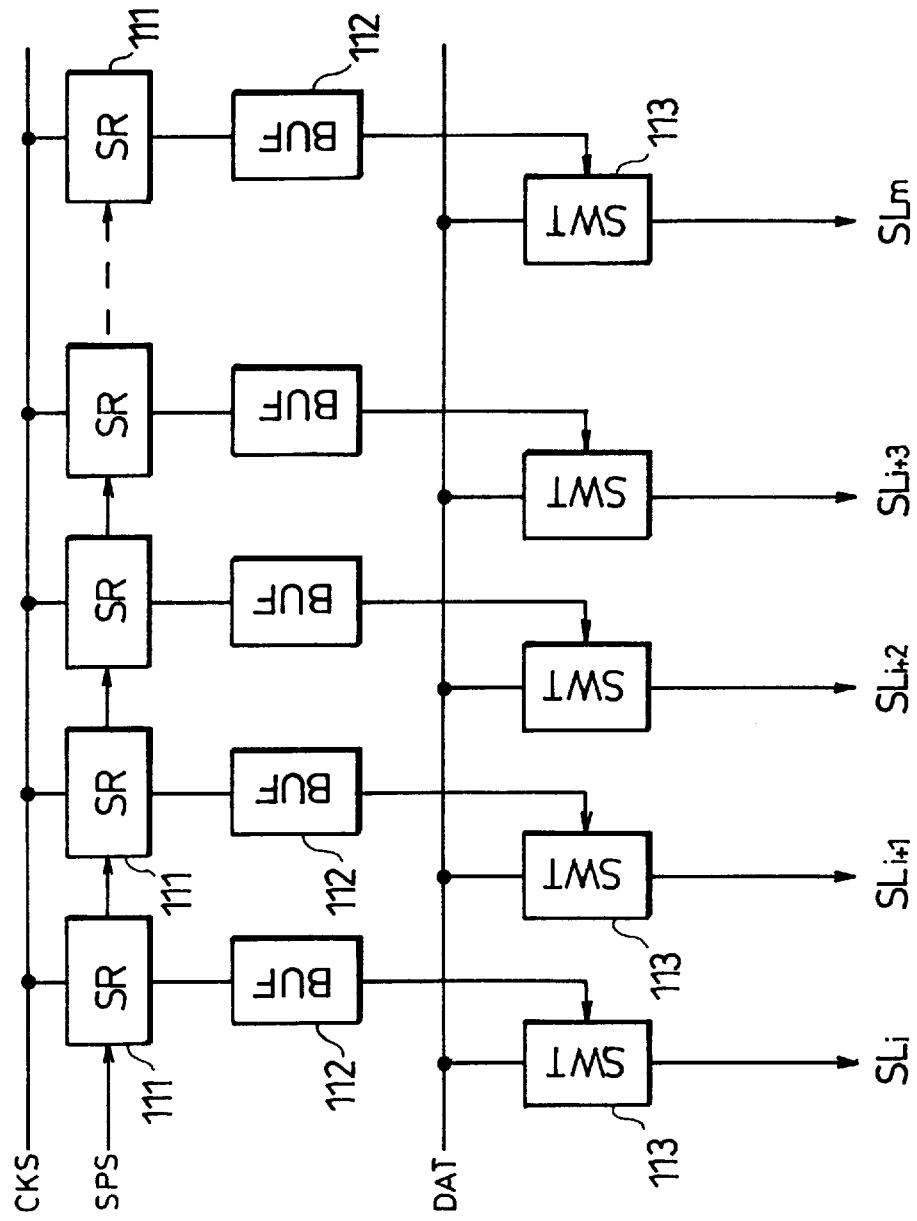
FIG. 20 is a block diagram showing a construction of a data-signal-line driving circuit of the image display of FIG. 19(a).
Figure 21:
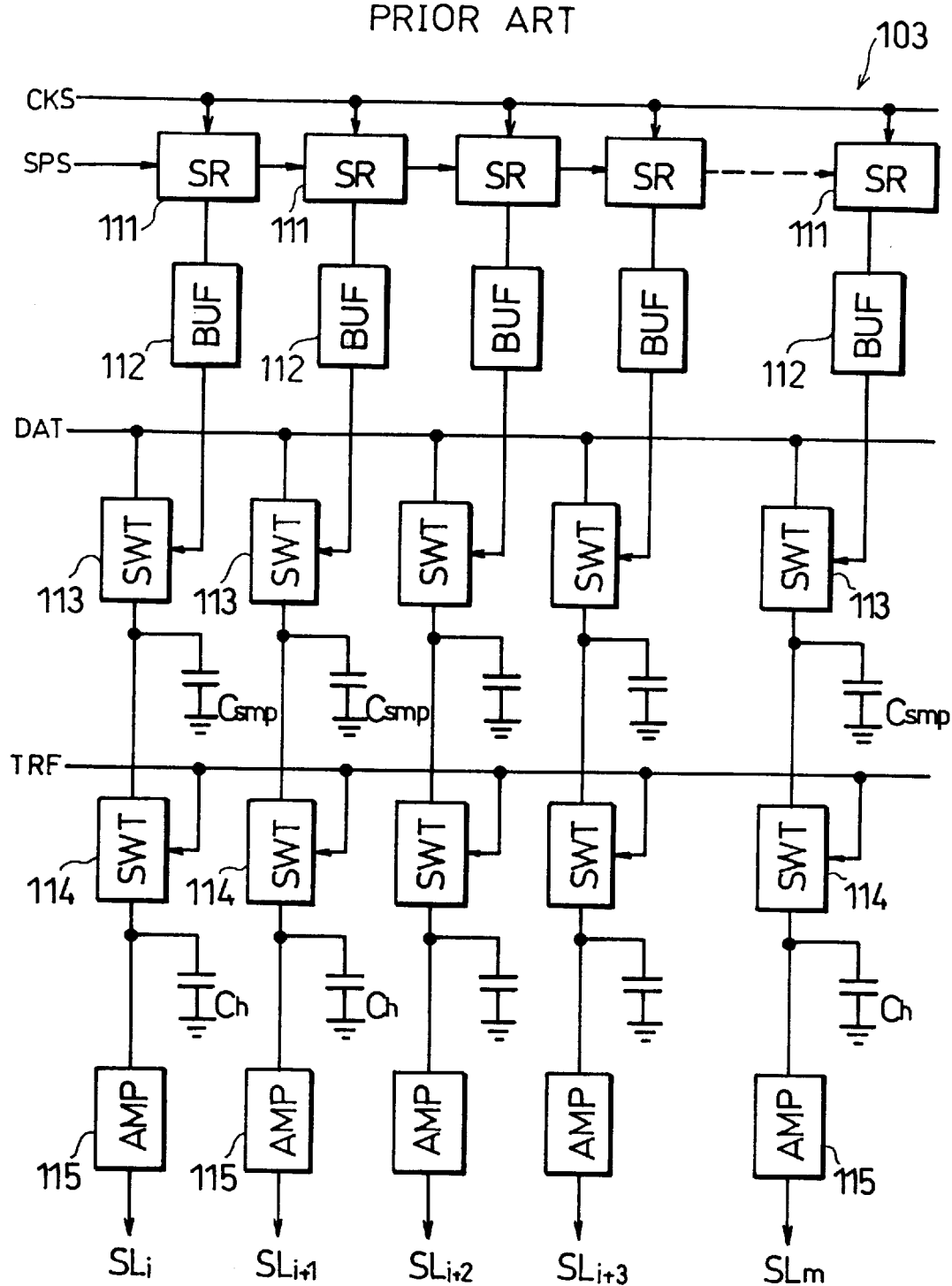
FIG. 21 is a block diagram showing another construction of a data-signal-line driving circuit of the image display of FIG. 19(a).
Figure 22:
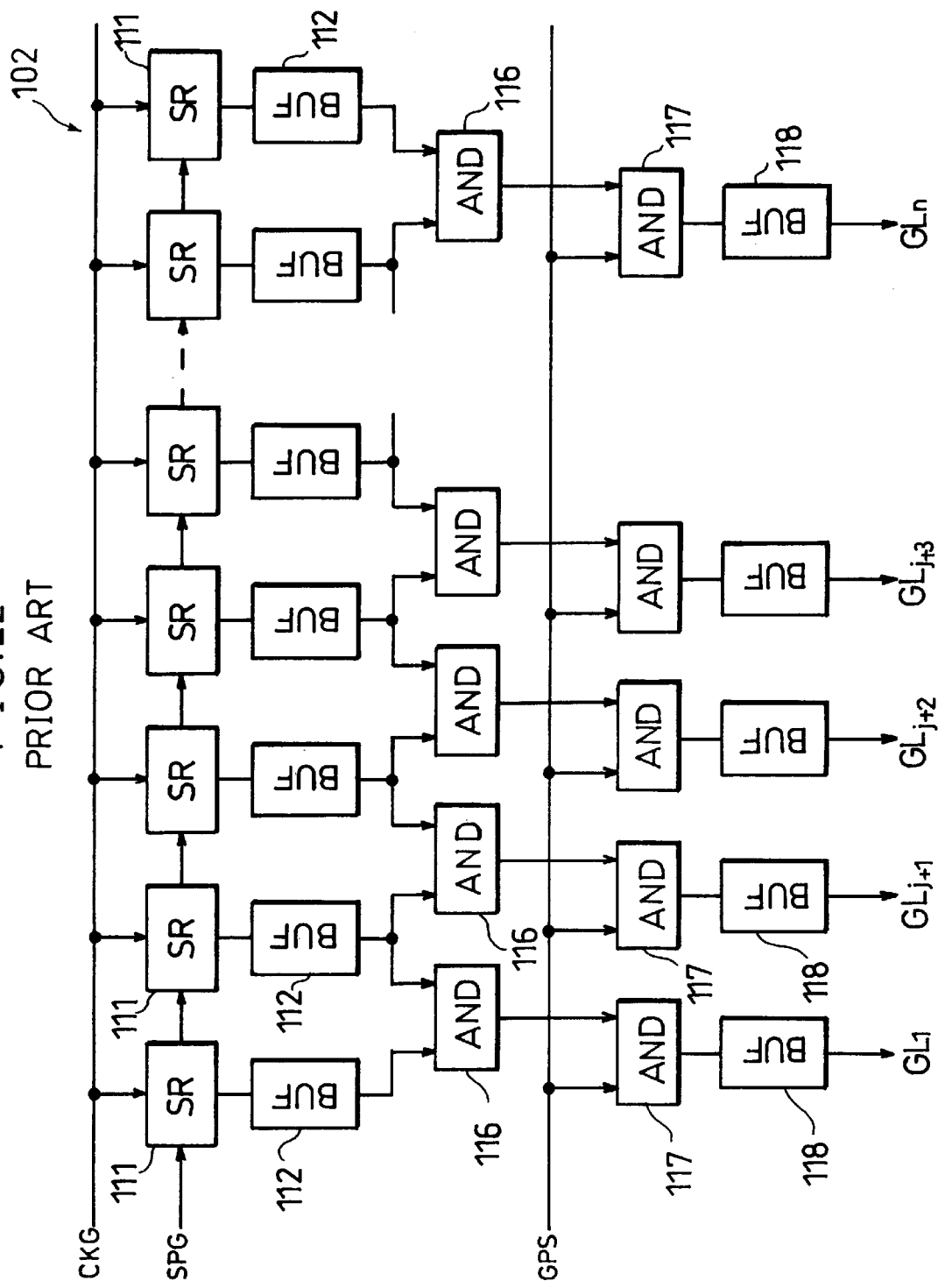
FIG. 22 is a block diagram showing a construction of a scanning-signal-line driving circuit of the image display of FIG. 19(a).
Figure 23:
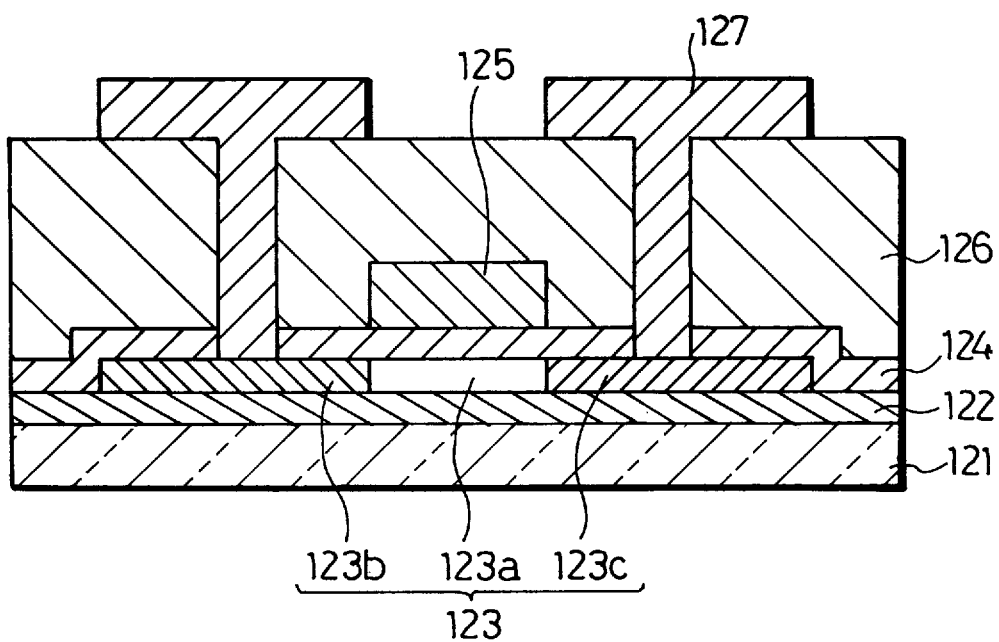
FIG. 23 is a cross-sectional view showing a structure of thin-film transistor that is used in the data-signal-line driving circuit and the scanning-signal-line driving circuit.

The pixel array 41, the data-signal-line driving circuit 42 and the scanning-signal-line driving circuit 43 are formed on a substrate 46. The substrate 46 is made of a material having an insulating property and a light-transmitting property, such as glass. The pixel array 41 has data signal lines SL, scanning signal lines GL and pixels 47, in the same manner as a conventional image display (see FIG. 19).

The data-signal-line driving circuit 42, which serves as a video-signal applying means, samples a video signal DAT that has been supplied by the control circuit 44 in accordance with a synchronous signal CKS and a start pulse SPS released from the control circuit 44, and outputs the resulting signal to the data signal lines $SL_i$, $SL_{i+1}$, ..., etc. that are connected to the pixels on each row. The scanning-signal-line driving circuit 43, which serves as a writing-control means, generates a scanning signal in accordance with synchronous signals CKG and GPS and a start pulse SPG released from the control circuit 44. The scanning signal is fed to the scanning signal lines $GL_j$, $GL_{j+1}$, ..., etc. that are connected to the pixels on each line.

The power-source circuit 45 is a circuit for generating source voltages $V_{SH}$, $V_{SL}$, $V_{GH}$ and $V_{GL}$, the ground potential COM and voltage $V_{BB}$. The source voltages $V_{SH}$ and $V_{SL}$, whose levels are different from each other, are applied to the data-signal-line driving circuit 42. The source voltages $V_{GH}$ and $V_{GL}$, whose levels are different from each other, are applied to the scanning-signal-line driving circuit 43. The source voltages $V_{GH}$, and $V_{GL}$ respectively contain the source voltages $V_{GH1}$ and $V_{GH2}$ and the source voltages $V_{GL1}$ and $V_{GL2}$ described in the fifth embodiment. The ground potential COM is applied to a common electrode line, not shown, that is installed in the substrate 46.

The voltage $V_{BB}$ is voltage to be applied to the conductive electrode 14, and the necessary number of voltages $V_{BB}$ and the necessary levels of voltage $V_{BB}$ are provided depending on arrangements of the conductive electrode 14 in the aforementioned respective embodiments. Since the voltage $V_{BB}$ is set to have different levels depending on the arrangement of the conductive electrode 14, it is preferable to design the power-source circuit 45 so as to be externally adjusted.

The data-signal-line driving circuit 42 and the scanning-signal-line driving circuit 43 respectively have any one of the shift registers 1 shown in FIGS. 3, 5 and 6. Alternatively, either the data-signal-line driving circuit 42 or the scanning-signal-line driving circuit 43 may have any one of the three types of the shift registers 1. Alternatively, at least either the data-signal-line driving circuit 42 or the scanning-signal-line driving circuit 43 may have the shift register 51 shown in FIG. 12.

In another arrangement of the present image display, the data-signal-line driving circuit 42 contains any one of the arrangements of the data-signal-line driving circuits 21 shown in FIGS. 7, 8, 9, 16 and 17 and the data-signal-line driving circuits 61 shown in FIGS. 10 and 11. The scanning-signal-line driving circuit 43 contains either of the arrangements of the scanning-signal-line driving circuits 31 shown in FIGS. 13 and 14. Alternatively, the data-signal-line driving circuit 42 may contain any one of the arrangements of the five types of the data-signal-line driving circuits 21, or the scanning-signal-line driving circuit 43 may contain either of the two types of the scanning-signal-line driving circuits 31.

In the present embodiment, both the data-signal-line driving circuit 42 and the scanning-signal-line driving circuit 43, or either of the two circuits, contain the transistors having the conductive electrode 14 shown in FIGS. 1(a) and 2(a) or FIGS. 1(b) and 2(b). With this arrangement, it is possible to shift the threshold voltage of the transistors consisting the data-signal-line driving circuit 42 or the scanning-signal-line driving circuit 43 so as to fit the required value. Thus, it becomes possible to provide image displays having superior operation speeds and good display quality.

In the present embodiment and the aforementioned other embodiments, various specific examples have been given with respect to the present invention; however, the present invention is not intended to be limited to those embodiments, and is applicable to all the arrangements that are made based upon the same concept.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thin-film transistor circuit, which is used as a driving circuit for driving pixels in an image display, comprising:
    a plurality of thin-film transistors that are formed on an insulating substrate, each thin-film transistor having a gate electrode and an active layer; and
    a conductive electrode that is commonly installed in each of the thin-film transistors in such a manner as to face a gate electrode with a channel region that is formed inside the active layer located in between, the conductive electrode being subjected to a constant voltage.

2. The thin-film transistor circuit as defined in claim 1, wherein the conductive electrodes are placed only either in n-channel-type thin-film transistors or in p-channel-type thin-film transistors.

3. The thin-film transistor circuit as defined in claim 1, wherein the conductive electrodes are placed only in thin-film transistors whose channel length is located within a predetermined range.

4. The thin-film transistor circuit as defined in claim 1, wherein the conductive electrodes are placed only either in thin-film transistors constituting a static circuit or in thin-film transistors constituting a dynamic circuit.

5. The thin-film transistor circuit as defined in claim 1, wherein the conductive electrodes are placed only in thin-film transistors that constitute a circuit that is driven by the same driving voltage.

6. The thin-film transistor circuit as defined in claim 1, wherein the conductive electrodes are placed only either in thin-film transistors that constitute an analog circuit or in thin-film transistors that constitute a digital circuit.

7. The thin-film transistor circuit as defined in claim 1, wherein the area and position of each conductive electrode are determined so that the conductive electrode faces only at least a channel region and a peripheral area of the active layer.

8. The thin-film transistor circuit as defined in claim 1, wherein the area and position of each conductive electrode are determined so that the conductive electrode faces the active layer in all the area thereof including the channel region thereof.

9. The thin-film transistor circuit as defined in claim 1, wherein the active layer is made of a semiconductor thin-film that is formed to have a film thickness of not more than two times the greatest width of a depletion layer.

10. The thin-film transistor circuit as defined in claim 1, wherein the conductive electrode is made of a light-shielding material.

11. A thin-film transistor circuit, which is used as a driving circuit for driving pixels in an image display, comprising:
    a plurality of thin-film transistors that are formed on an insulating substrate and that are classified into groups based upon predetermined attributes, each thin-film transistor being provided with a gate electrode and an active layer; and
    a plurality of conductive electrodes that are commonly installed in each group of the thin-film transistors in such a manner that each faces the gate electrode with a channel region that is formed inside the active layer located in between, the conductive electrodes being subjected to constant voltages, each of which is different from the others.

12. The thin-film transistor circuit as defined in claim 11, wherein the conductive electrodes are placed in n-channel-type thin-film transistors and p-channel-type thin-film transistors in a separate manner.

13. The thin-film transistor circuit as defined in claim 11, wherein, in the case of thin-film transistors that are classified into groups depending on their channel lengths, the conductive electrodes are placed in the thin-film transistors in a separate manner based on the respective groups.

14. The thin-film transistor circuit as defined in claim 11, wherein, in the case of thin-film transistors constituting a static circuit and those constituting a dynamic circuit, the conductive electrodes are placed in a separate manner based on the two types of circuits.

15. The thin-film transistor circuit as defined in claim 11, wherein, in the case of thin-film transistors that are classified into groups depending on their driving voltages, the conductive electrodes are placed in the thin-film transistors in a separate manner based on the respective groups.

16. The thin-film transistor circuit as defined in claim 11, wherein, in the case of thin-film transistors constituting an analog circuit and those constituting a digital circuit, the conductive electrodes are placed in a separate manner based on the two types of circuits.

17. The thin-film transistor circuit as defined in claim 11, wherein, in the case of thin-film transistors that are classified into groups depending on their channel lengths, the conductive electrodes are placed in the thin-film transistors of only any of the groups.

18. The thin-film transistor circuit as defined in claim 11, wherein, in the case of thin-film transistors that are classified into groups depending on their driving voltages, the conductive layers are placed in the thin-film transistors of only any of the groups.

19. The thin-film transistor circuit as defined in claim 11, wherein the area and position of each conductive electrode are determined so that the conductive electrode faces only at least a channel region and a peripheral area of the active layer.

20. The thin-film transistor circuit as defined in claim 11, wherein the area and position of each conductive electrode are determined so that the conductive electrode faces the active layer in all the area thereof including the channel region thereof.

21. The thin-film transistor circuit as defined in claim 11, wherein the active layer is made of a semiconductor thin-film that is formed to have a film thickness of not more than two times the greatest width of a depletion layer.

22. The thin-film transistor circuit as defined in claim 11, wherein the conductive electrode is made of a light-shielding material.

23. An image display comprising:
    a plurality of display-use pixels that are formed in a matrix shape;
    video-signal applying means for applying a video signal to the pixels for each line; and writing-control means for controlling a writing process of the video signal to the pixels for each row, wherein at least either the video-signal applying means or the writing-control means includes a thin-film transistor circuit comprising:

a plurality of thin-film transistors that are formed on an insulating substrate, each thin-film transistor having a gate electrode and an active layer; and a conductive electrode that is commonly installed in each of the thin-film transistors in such a manner as to face a gate electrode with a channel region that is formed inside the active layer located in between, the conductive electrode being subjected to a constant voltage.

24. The image display as defined in claim 23, wherein the conductive electrodes are placed only either in n-channel-type thin-film transistors or in p-channel-type thin-film transistors.

25. The image display as defined in claim 24, comprising a shift register that is constituted of the n-channel-type thin-film transistors and the p-channel-type thin-film transistors.

26. The image display as defined in claim 23, wherein the conductive electrodes are placed only in thin-film transistors whose channel length is located within a predetermined range.

27. The image display as defined in claim 26, comprising a shift register that is constituted of thin-film transistors whose channel length is the shortest, the thin-film transistors being provided with the conductive electrodes.

28. The image display as defined in claim 23, wherein the conductive electrodes are placed only either in thin-film transistors constituting a static circuit or in thin-film transistors constituting a dynamic circuit.

29. The image display as defined in claim 28, comprising:
a shift register that functions as the dynamic circuit;
a buffer that functions as the static circuit and that amplifies signals outputted from respective output stages of the shift register; and
a sampling circuit for sampling a video signal for each row in response to a signal that has passed through the buffer, the sampling circuit serving as a static circuit.

30. The image display as defined in claim 23, wherein the conductive electrodes are placed only in thin-film transistors that constitute a circuit that is driven by the same driving voltage.

31. The image display as defined in claim 30, comprising a logical circuit that is provided with the conductive electrodes.

32. The image display as defined in claim 23, wherein the conductive electrodes are placed only either in thin-film transistors that constitute an analog circuit or in thin-film transistors that constitute a digital circuit.

33. The image display as defined in claim 32, comprising a sampling circuit that functions as an analog circuit and that samples a video signal for each row.

34. The image display as defined in claim 23, wherein the area and position of each conductive electrode are determined so that the conductive electrode faces only at least a channel region and a peripheral area of the active layer.

35. The image display as defined in claim 23, wherein the area and position of each conductive electrode are determined so that the conductive electrode faces the active layer in all the area thereof including the channel region thereof.

36. The image display as defined in claim 23, wherein the active layer is made of a semiconductor thin-film that is formed to have a film thickness of not more than two times the greatest width of a depletion layer.

37. The image display as defined in claim 23, wherein the conductive electrode is made of a light-shielding material.

38. The image display as defined in claim 23, wherein the pixels are formed on the insulating substrate together with the thin-film transistor circuit so as to be driven by an active-matrix driving system.

39. An image display comprising:
a plurality of display-use pixels that are formed in a matrix shape;
video-signal applying means for applying a video signal to the pixels for each row; and
writing-control means for controlling a writing process of the video signal to the pixels for each line,
wherein at least either the video-signal applying means or the writing-control means includes a thin-film transistor circuit comprising:
a plurality of thin-film transistors that are formed on an insulating substrate and that are classified into groups based upon predetermined attributes, each thin-film transistor being provided with a gate electrode and an active layer; and
a plurality of conductive electrodes that are commonly installed in each group of the thin-film transistors in such a manner that each faces the gate electrode with a channel region that is formed inside the active layer located in between, the conductive electrodes being subjected to constant voltages, each of which is different from the others.

40. The image display as defined in claim 39, wherein the conductive electrodes are placed in n-channel-type thin-film transistors and in p-channel-type thin-film transistors respectively in a separate manner.

41. The image display as defined in claim 40, comprising a shift register that is constituted of the n-channel-type thin-film transistors and the p-channel-type thin-film transistors.

42. The image display as defined in claim 39, wherein, in the case of thin-film transistors that are classified into groups depending on their channel lengths, the conductive electrodes are placed in the thin-film transistors in a separate manner based on the respective groups.

43. The image display as defined in claim 42, comprising:
a shift register that is constituted of thin-film transistors whose channel length is the shortest;
a buffer that is constituted of thin-film transistors whose channel length is longer than the channel length of the thin-film transistors constituting the shift register and that amplifies signals outputted from respective output stages of the shift register; and
a sampling circuit that is constituted of thin-film transistors whose channel length is longer than the channel length of the thin-film transistors constituting the buffer and that samples a video signal for each row in response to a signal that has passed through the buffer,
wherein the conductive electrodes are placed in the shift register and in the buffer and sampling circuit respectively in a separate manner.

44. The image display as defined in claim 39, wherein the conductive electrodes are placed in the thin-film transistors constituting a static circuit and in the thin-film transistors constituting a dynamic circuit respectively in a separate manner.

45. The image display as defined in claim 44, comprising:
a shift register that functions as a dynamic circuit;
a buffer that functions as a static circuit and that amplifies a signal outputted from respective output stages of the shift register; and a sampling circuit that functions as a static circuit and that samples a video signal for each row in response to a signal that has passed through the buffer.

46. The image display as defined in claim 39, wherein in the case of circuit-forming thin-film transistors that are classified into groups depending on their driving voltages, the conductive electrodes are placed in the thin-film transistors in a separate manner based on the respective groups.

47. The image display as defined in claim 46, comprising:

a logical circuit that belongs to one of the groups having a low driving voltage; and a driver that belongs to one of the groups having a high driving voltage and that applies a change in voltage to an output signal from the logical circuit.

48. The image display as defined in claim 39, wherein the conductive electrodes are placed in the thin-film transistors constituting an analog circuit and in the thin-film transistors constituting a digital circuit respectively in a separate manner.

49. The image display as defined in claim 48, comprising:

a shift register that functions as the digital circuit;

a buffer that functions as the digital circuit and that amplifies a signal outputted from respective output stages of the shift register; and a sampling circuit that functions as the analog circuit and that samples a video signal for each row in response to a signal that has passed through the buffer.

50. The image display as defined in claim 39, wherein, in the case of thin-film transistors that are classified into groups depending on their channel lengths, the conductive electrodes are placed in the thin-film transistors of only any of the groups.

51. The image display as defined in claim 50, comprising:

a shift register that is constituted of thin-film transistors whose channel length is the shortest;

a buffer that is constituted of thin-film transistors whose channel length is longer than the channel length of the thin-film transistors constituting the shift register and that amplifies signals outputted from respective output stages of the shift register; and a sampling circuit that is constituted of thin-film transistors whose channel length is longer than the channel length of the thin-film transistors constituting the buffer and that samples a video signal for each row in response to a signal that has passed through the buffer, wherein the conductive electrodes are placed in the shift register and the sampling circuit respectively in a separate manner.

52. The image display as defined in claim 39, wherein, in the case of thin-film transistors that are classified into groups depending on their driving voltages, the conductive electrodes are placed in the thin-film transistors of only any of the groups.

53. The image display as defined in claim 39, wherein the area and position of each conductive electrode are determined so that the conductive electrode faces only at least a channel region and a peripheral area of the active layer.

54. The image display as defined in claim 39, wherein the area and position of each conductive electrode are determined so that the conductive electrode faces the active layer in all the area thereof including the channel region thereof.

55. The image display as defined in claim 39, wherein the active layer is made of a semiconductor thin-film that is formed to have a film thickness of not more than two times the greatest width of a depletion layer.

56. The image display as defined in claim 39, wherein the conductive electrode is made of a light-shielding material.

57. The image display as defined in claim 39, wherein the pixels are formed on the insulating substrate together with the thin-film transistor circuit so as to be driven by an active-matrix driving system.

\* \* \* \* \*